United States Patent [19]

Palac et al.

[11] 4,020,493
[45] Apr. 26, 1977

[54] PHOTOGRAPHIC MASTER FOR USE IN SCREENING A COLOR CATHODE RAY TUBE

[75] Inventors: Kazimir Palac, Carpentersville; Raymond M. Stachniak, Wheaton, both of Ill.

[73] Assignee: Zenith Radio Corporation, Chicago, Ill.

[22] Filed: Nov. 21, 1975

[21] Appl. No.: 634,201

Related U.S. Application Data

[62] Division of Ser. No. 535,614, Dec. 23, 1974, Pat. No. 3,975,198.

[52] U.S. Cl. ................................. 354/1; 96/36.1; 313/402
[51] Int. Cl.² ................. G03B 41/00; G03C 5/00; H01J 29/80
[58] Field of Search ................. 354/1; 219/109; 313/402, 405, 406, 407, 408, 482, 481, 403; 96/36.1

[56] References Cited

UNITED STATES PATENTS

| | | |
|---|---|---|
| 3,231,380 | 1/1966 | Law .............................. 313/402 X |
| 3,450,920 | 6/1969 | Engels et al. ..................... 313/402 |
| 3,873,875 | 3/1975 | Miller ............................. 313/405 |
| 3,889,329 | 6/1975 | Fazlin ............................. 96/36 X |
| 3,890,151 | 6/1975 | Suzuki et al. ..................... 354/1 X |
| 3,904,914 | 9/1975 | Palac .......................... 313/406 X |
| 3,912,963 | 10/1975 | Sedivy ............................ 313/402 |

Primary Examiner—Donald A. Griffin
Attorney, Agent, or Firm—John H. Coult

[57] ABSTRACT

This disclosure depicts a novel low cost, high performance color cathode ray tube of the shadow mask type, and methods and apparatus for manufacturing the tube. The tube has a novel envelope, on a faceplate portion of which is corner-suspended a lightweight, non-self-rigid shadow mask. The tube has a variety of features and is especially adapted to be made by manufacturing methods which permit the screened faceplates to be interchanged, each with all others, and the shadow masks to be interchanged, each with all others, with consequent economies in manufacture and enhanced tube performance. This disclosure stresses the structure of masters employed in the making of the screen.

2 Claims, 84 Drawing Figures

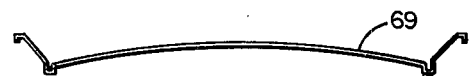
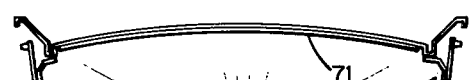
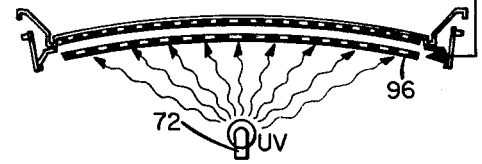
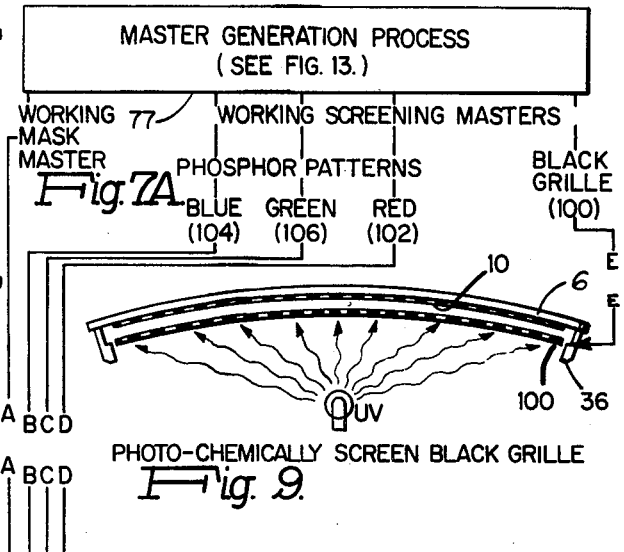
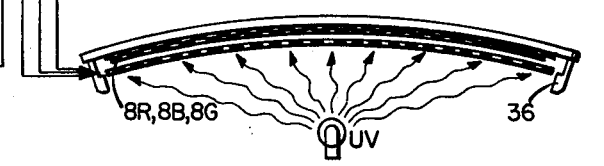
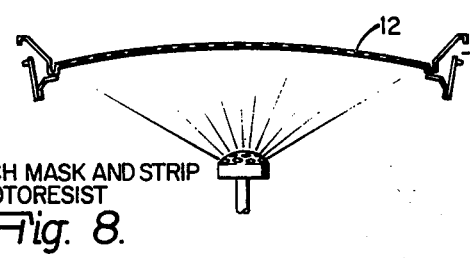
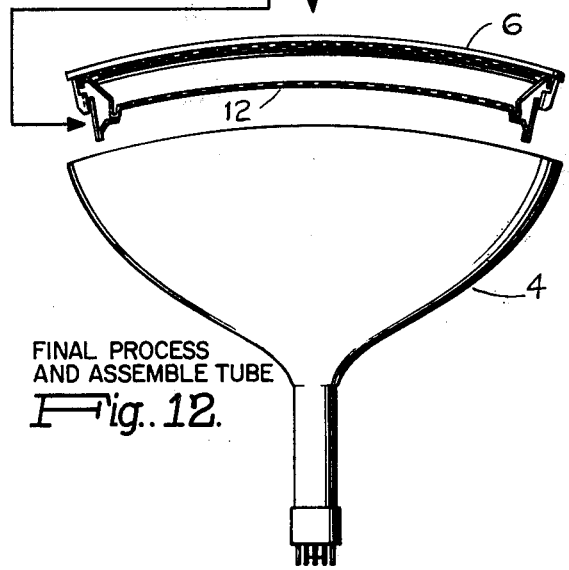

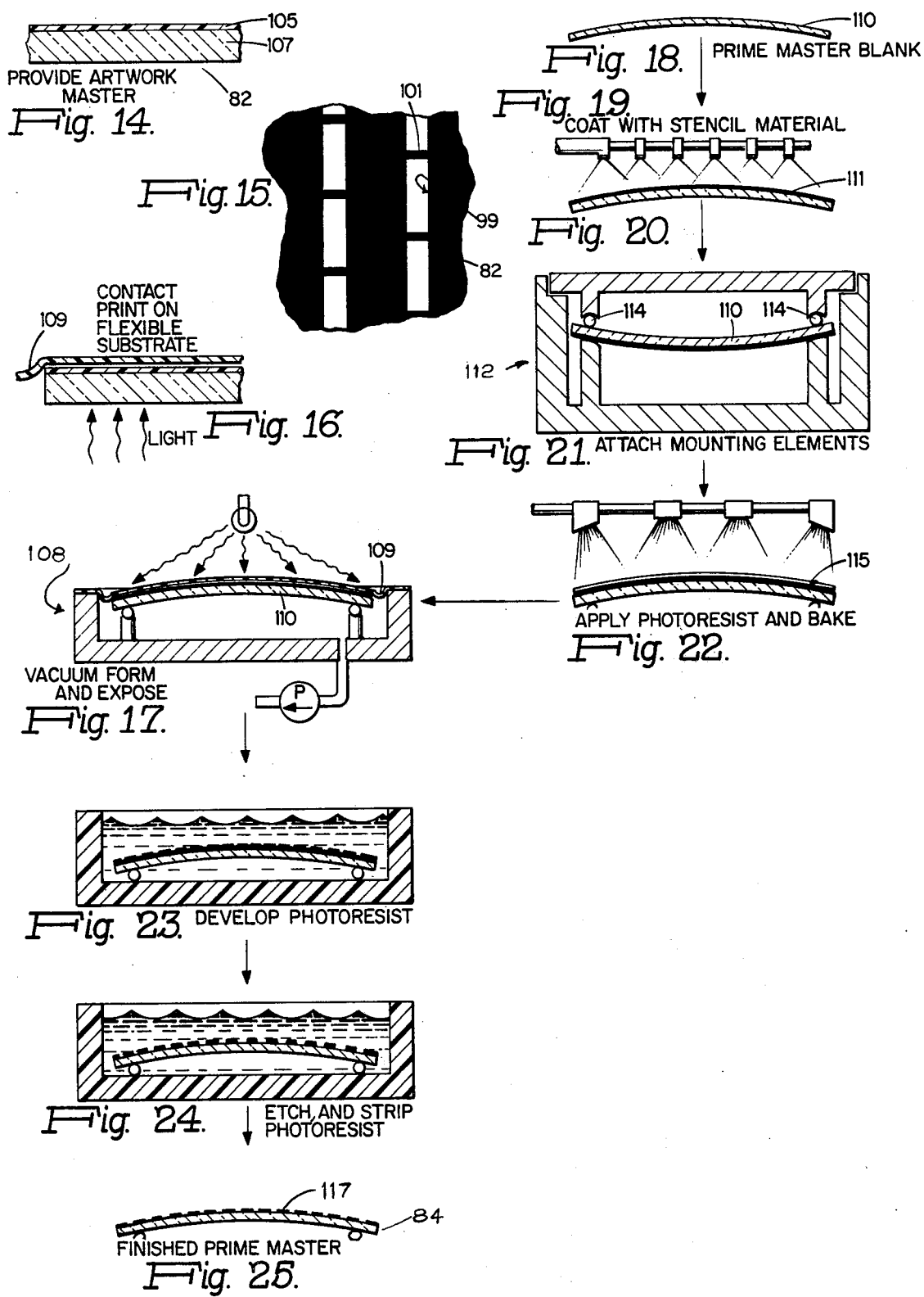

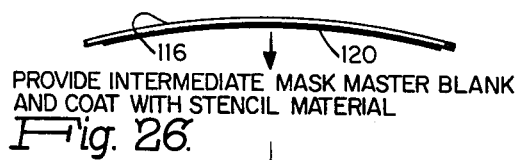
PROVIDE INTERMEDIATE MASK MASTER BLANK AND COAT WITH STENCIL MATERIAL
Fig. 26.

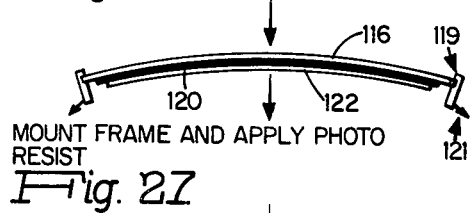
MOUNT FRAME AND APPLY PHOTO RESIST
Fig. 27.

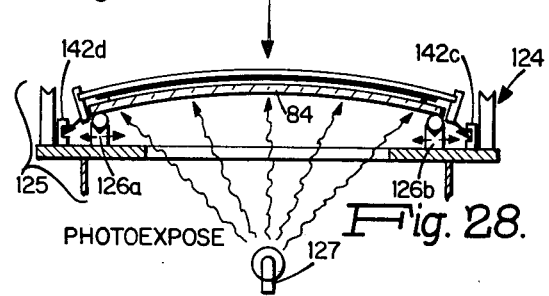
PHOTOEXPOSE
Fig. 28.

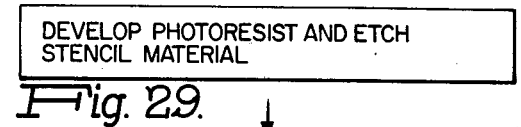
DEVELOP PHOTORESIST AND ETCH STENCIL MATERIAL
Fig. 29.

FINISHED INTERMEDIATE MASK MASTER
Fig. 30.

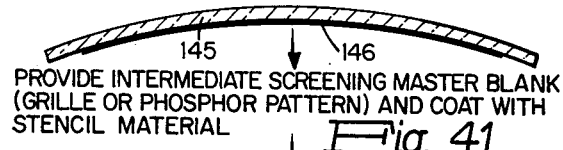
PROVIDE INTERMEDIATE SCREENING MASTER BLANK (GRILLE OR PHOSPHOR PATTERN) AND COAT WITH STENCIL MATERIAL
Fig. 41.

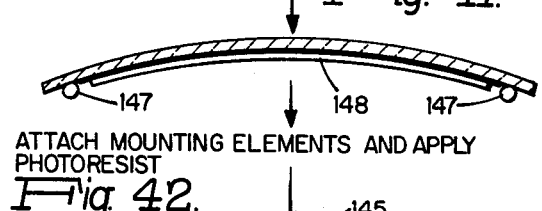
ATTACH MOUNTING ELEMENTS AND APPLY PHOTORESIST
Fig. 42.

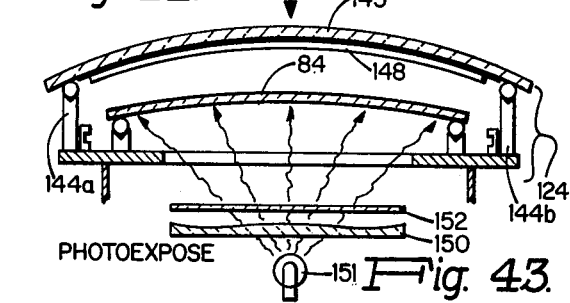
PHOTOEXPOSE
Fig. 43.

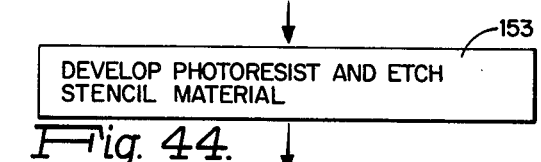
DEVELOP PHOTORESIST AND ETCH STENCIL MATERIAL
Fig. 44.

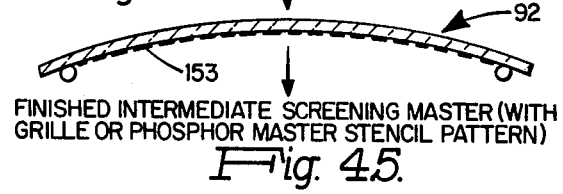
FINISHED INTERMEDIATE SCREENING MASTER (WITH GRILLE OR PHOSPHOR MASTER STENCIL PATTERN)
Fig. 45.

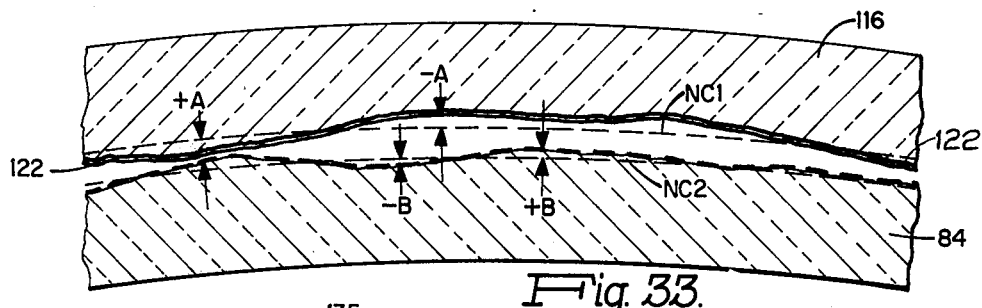
Fig. 33.

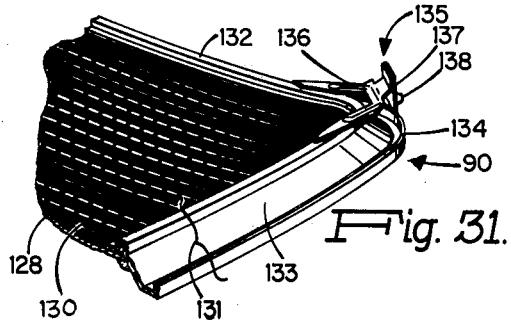
Fig. 31.

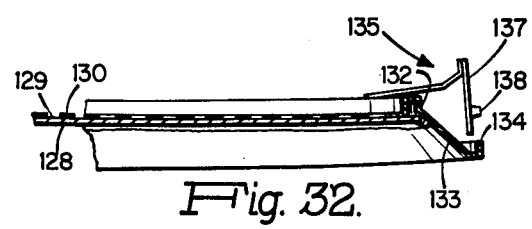
Fig. 32.

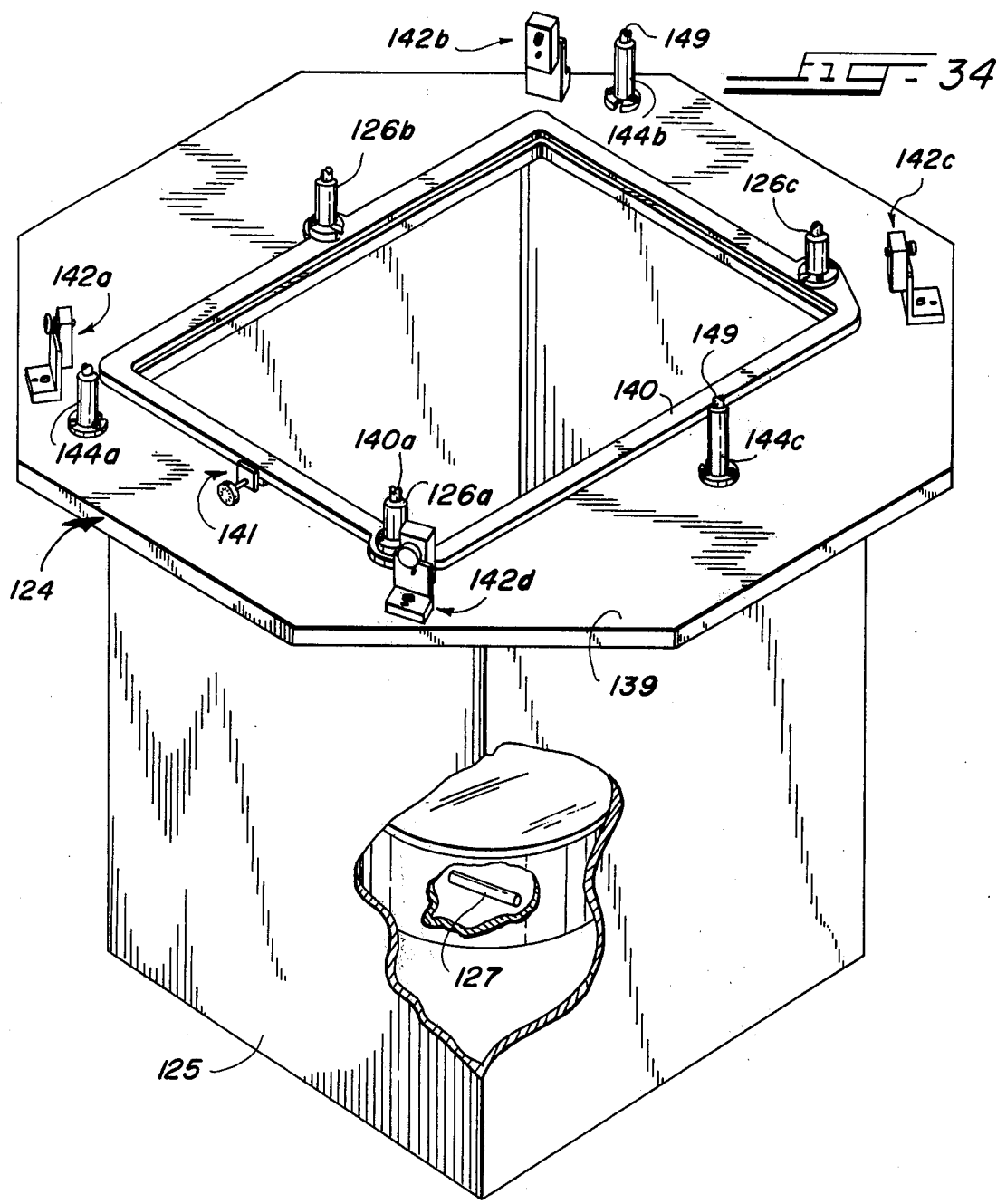

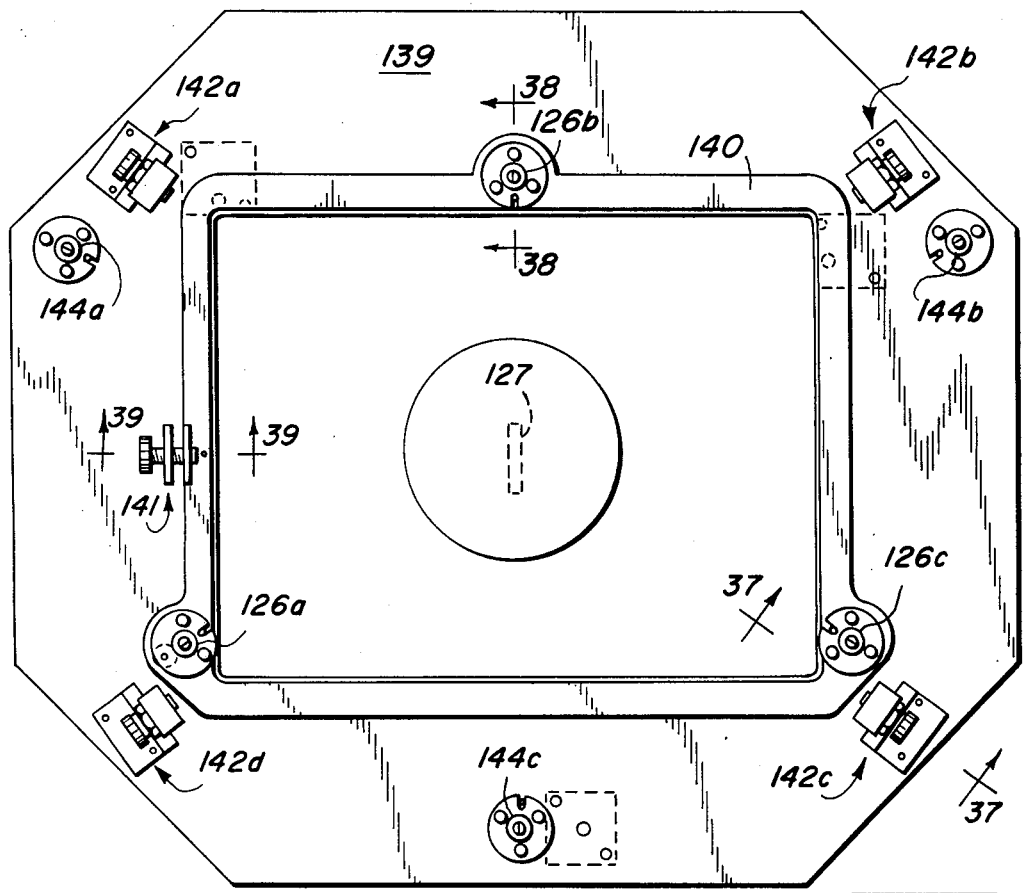
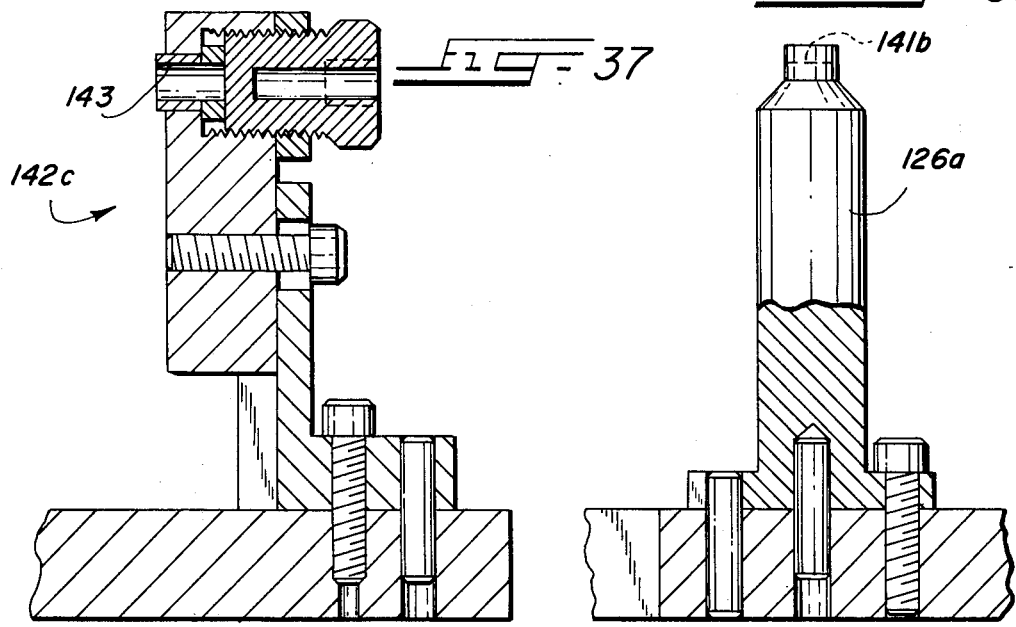

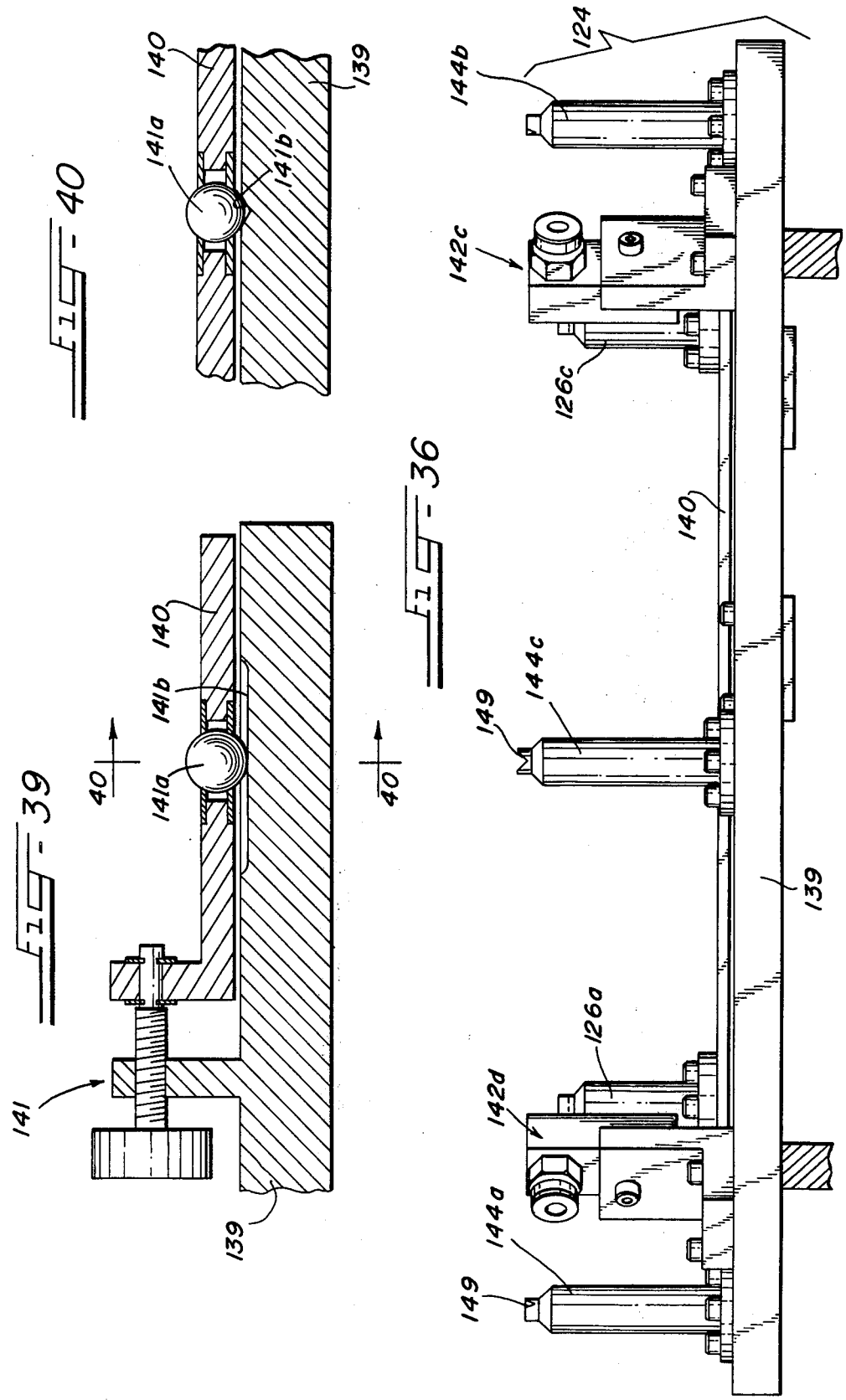

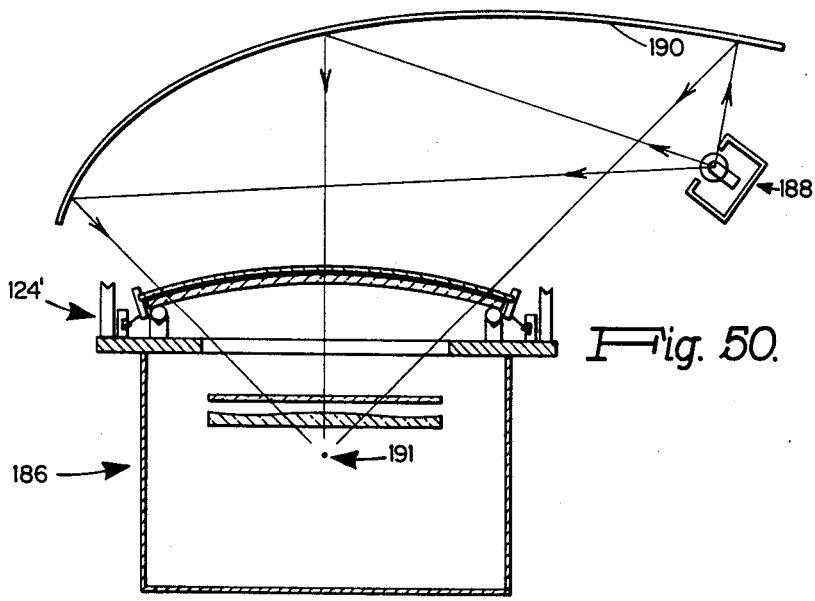

*Fig. 50.*

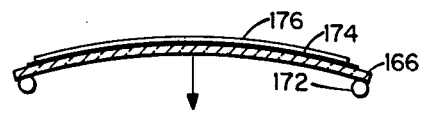

PROVIDE WORKING MASK MASTER BLANK, ATTACH MOUNTING ELEMENTS AND COAT WITH STENCIL MATERIAL AND PHOTORESIST

*Fig. 46.*

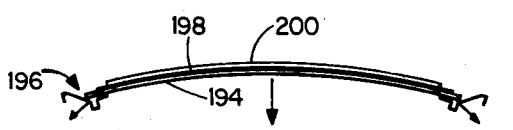

PROVIDE WORKING SCREENING MASTER BLANK, ATTACHING MOUNTING ELEMENTS AND COAT WITH STENCIL MATERIAL AND PHOTORESIST

*Fig. 51.*

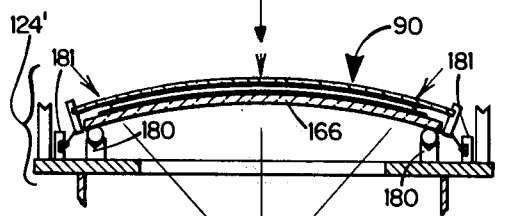

PHOTOEXPOSE   *Fig. 47.*

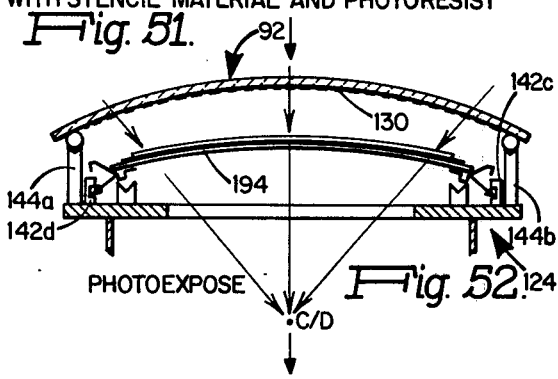

PHOTOEXPOSE   *Fig. 52.*

DEVELOP PHOTORESIST AND ETCH STENCIL MATERIAL

*Fig. 48.*

DEVELOP PHOTORESIST AND ETCH STENCIL MATERIAL

*Fig. 53.*

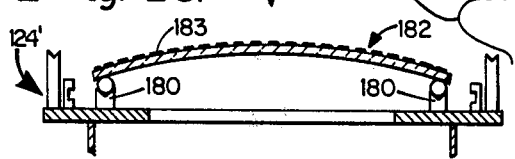

FINISHED WORKING MASK MASTER   *Fig. 49.*

FINISHED WORKING SCREENING MASTER WITH GRILLE OR PHOSPHOR MASTER STENCIL PATTERN

*Fig. 54.*

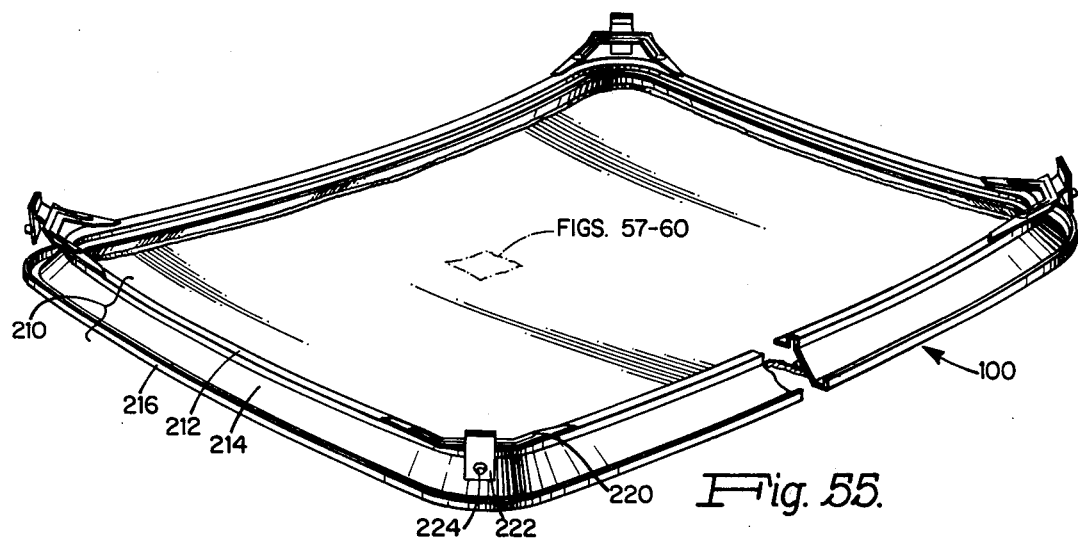
Fig. 55.
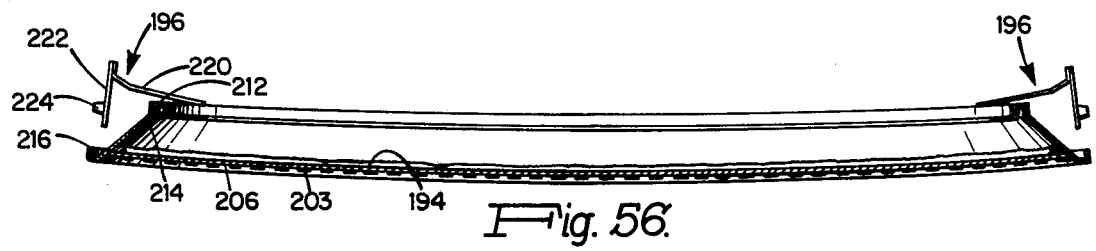
Fig. 56.
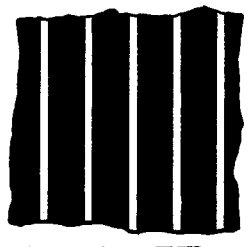 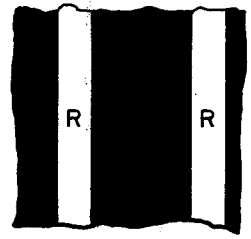 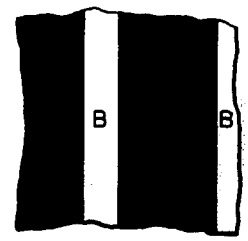 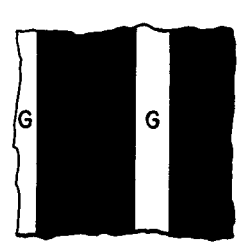
Fig. 57.   Fig. 58.   Fig. 59.   Fig. 60.

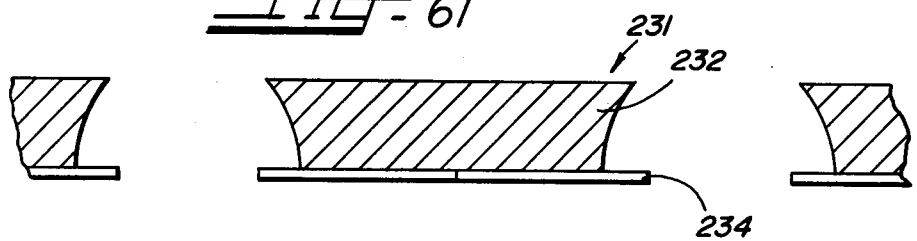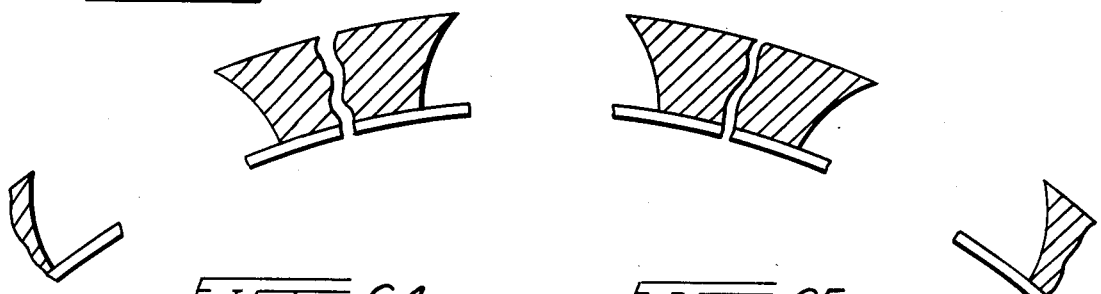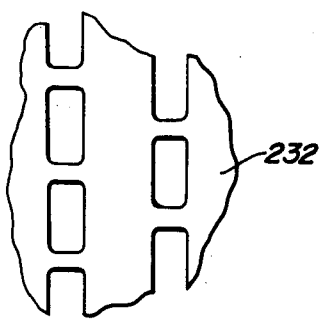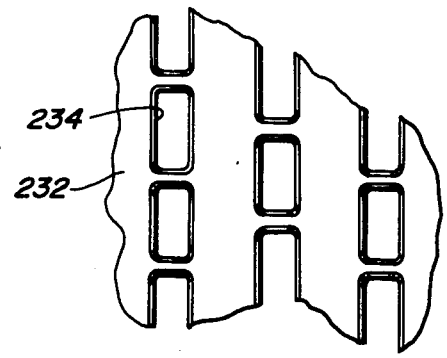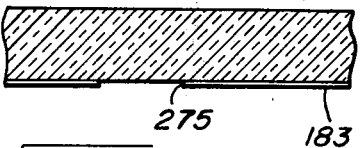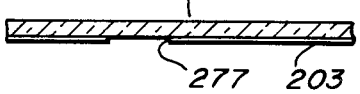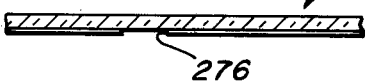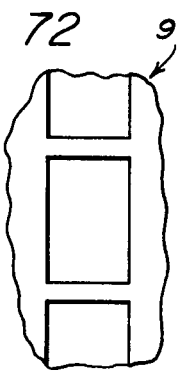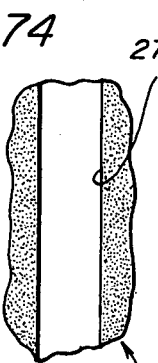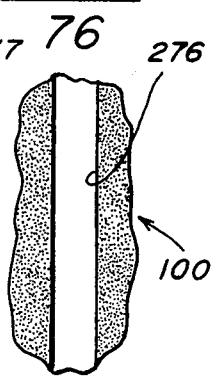

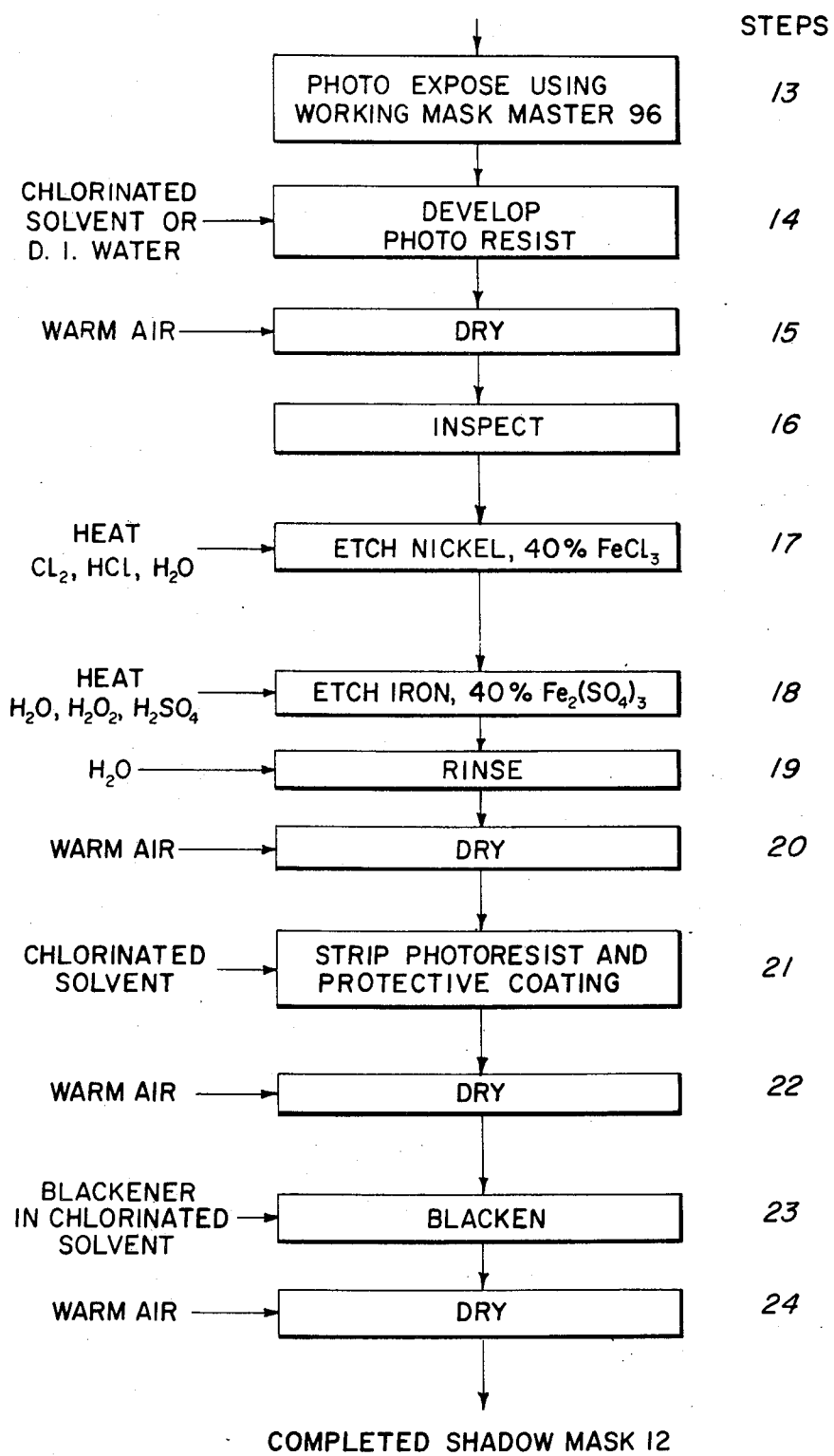

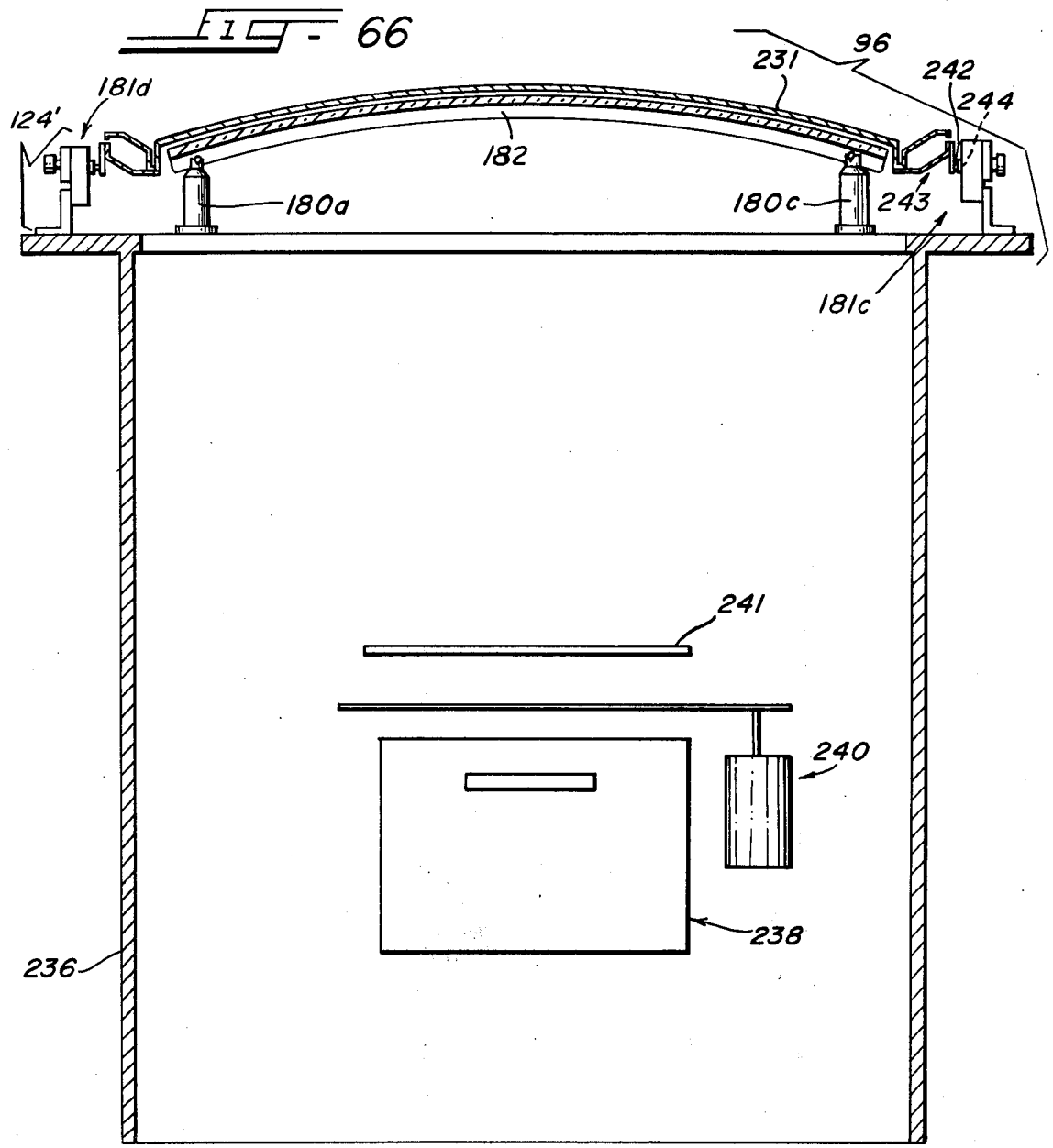

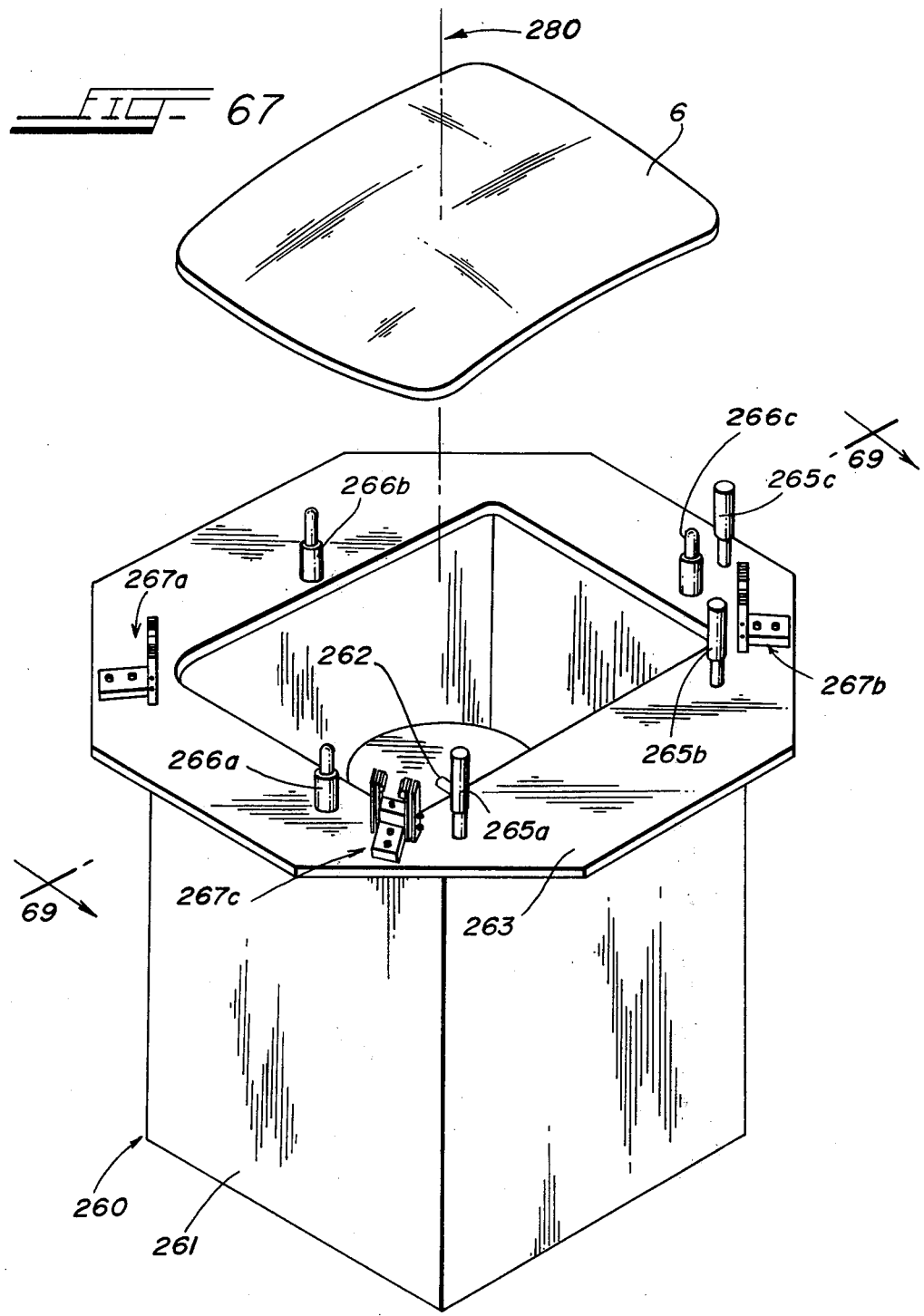

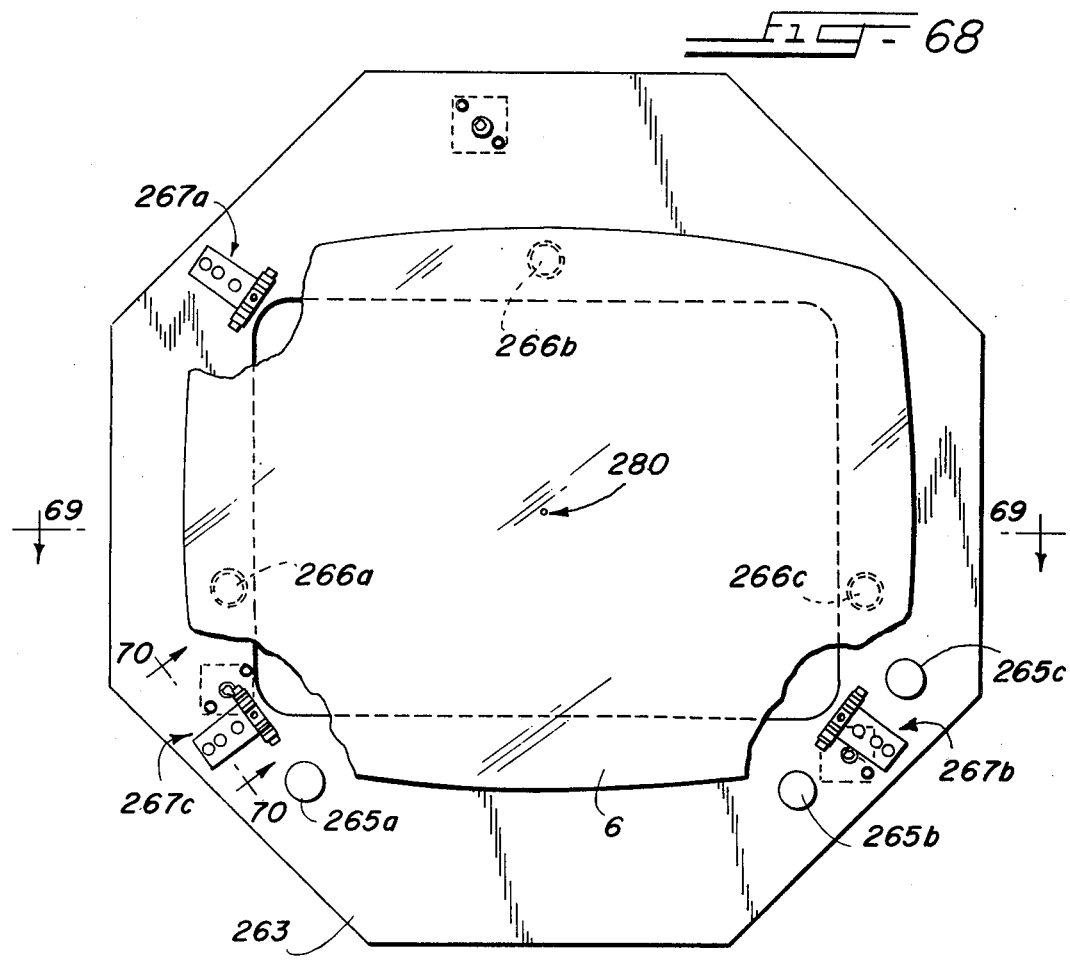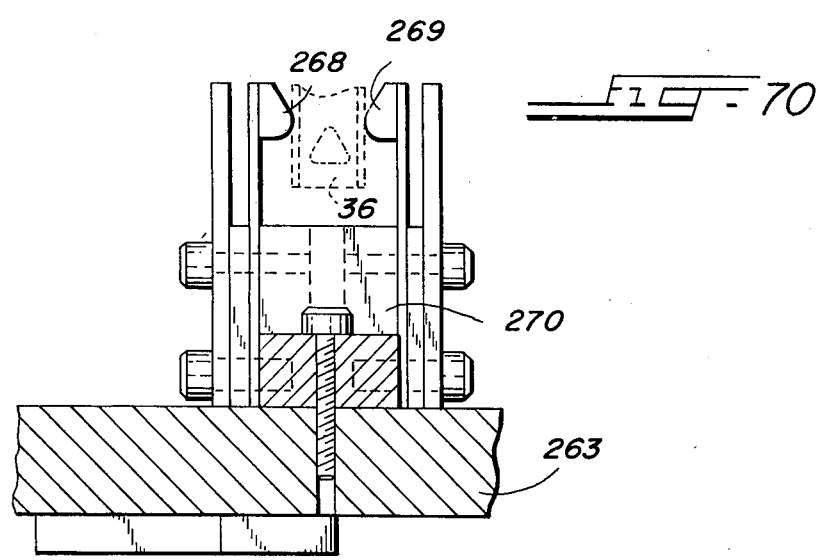

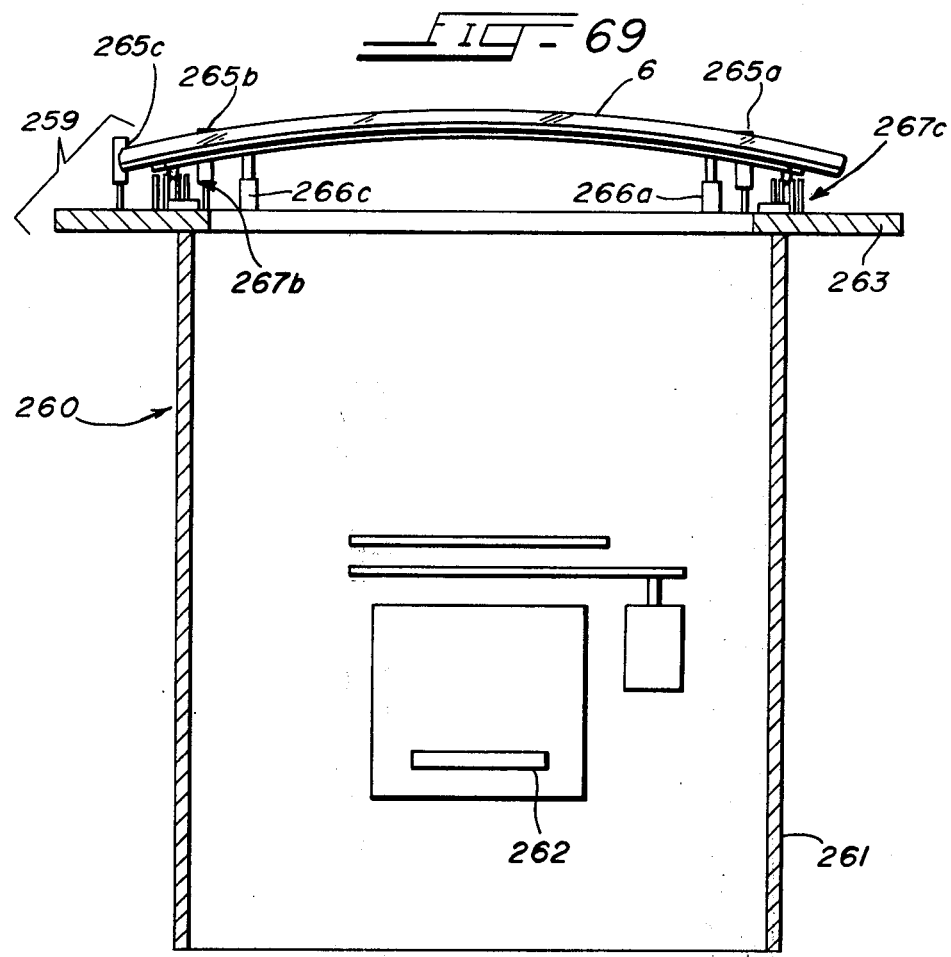

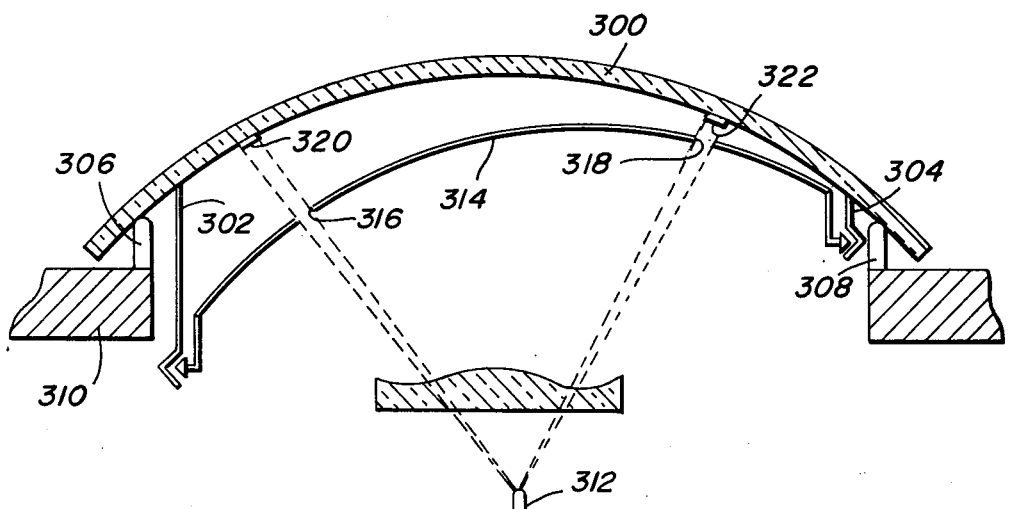
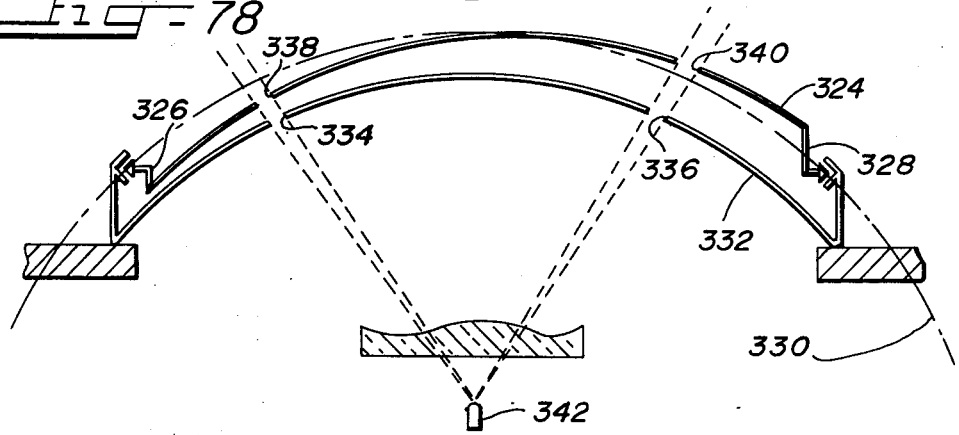
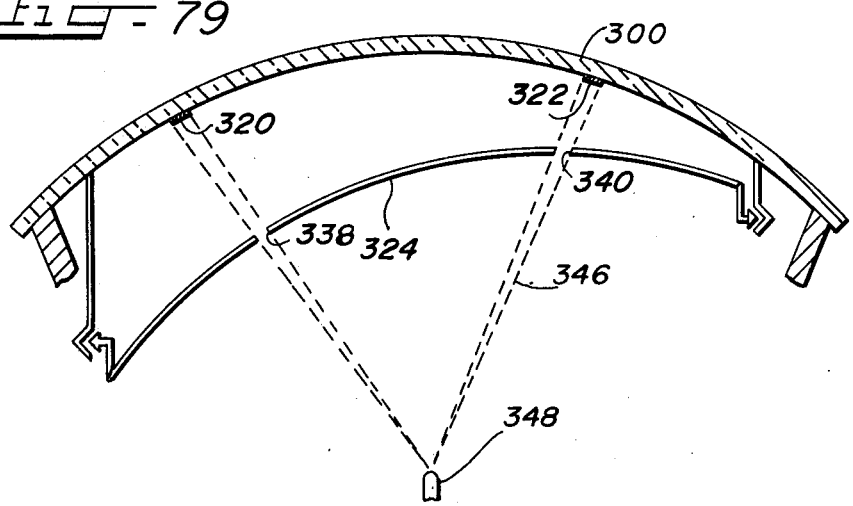

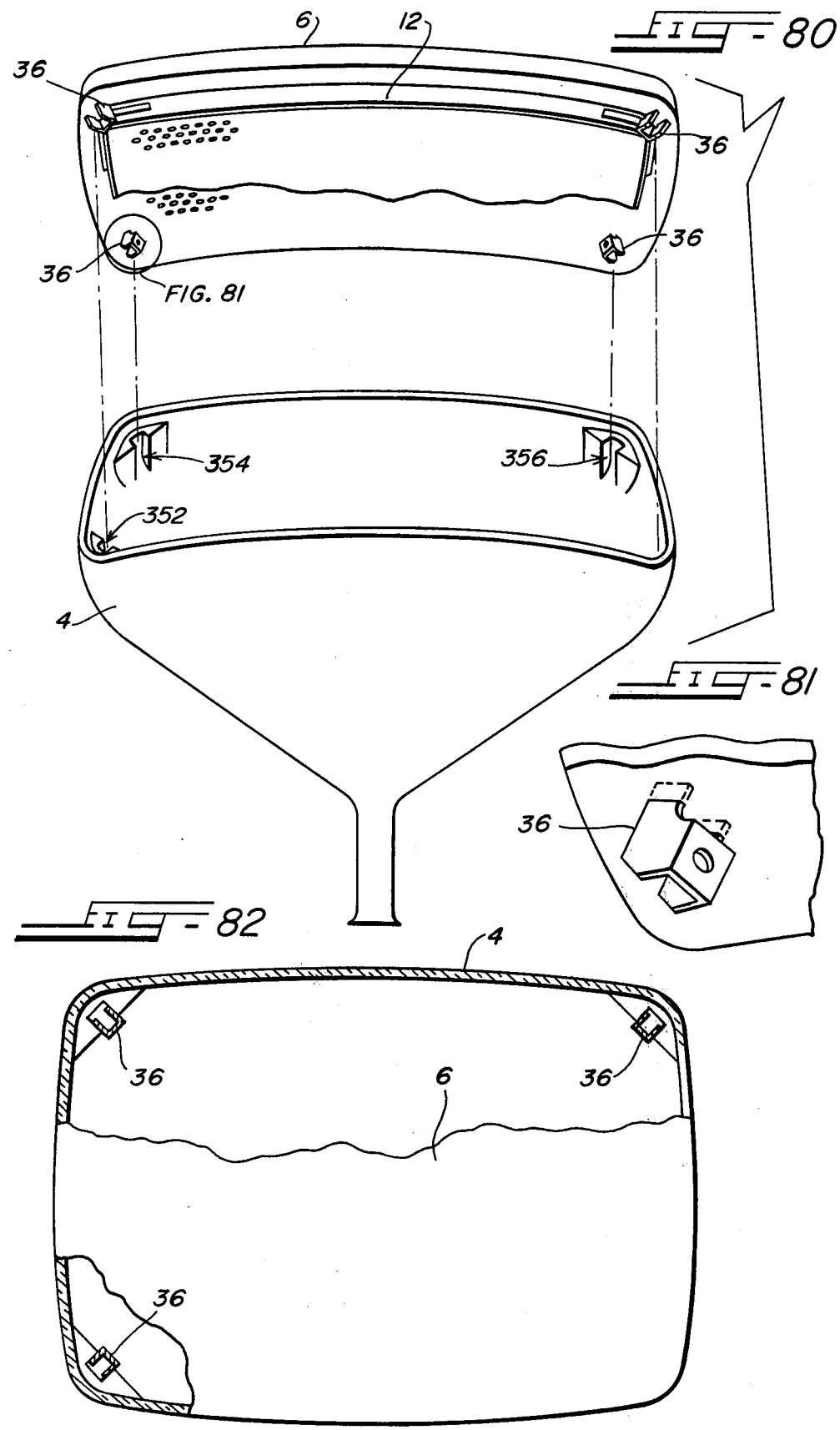

PHOTOGRAPHIC MASTER FOR USE IN SCREENING A COLOR CATHODE RAY TUBE

CROSS-REFERENCE TO RELATED APPLICATIONS

This application is a division of copending application Ser. No. 535,614, filed Dec. 23, 1974 now U.S. Pat. No. 3,975,198 issued Aug. 17, 1976.

This application is related to, but not dependent upon, copending applications including: Ser. No. 285,985, filed Sept. 5, 1972 which has been abandoned in favor of continuation application Ser. No. 498,836, filed Aug. 19, 1974; Ser. No. 665,035, filed Mar. 8, 1976, a continuation of Ser. No. 384,874, filed Aug. 2, 1973 now abandoned; Ser. No. 395,106, filed Sept. 7, 1973 which has been abandoned in favor of continuation-in-part application Ser. No. 535,473, filed Dec. 23, 1974 now U.S. Pat. No. 3,943,399; Ser. No. 462,915, filed Apr. 22, 1974 now U.S. Pat. No. 3,971,490; Ser. No. 527,001, filed Nov. 25, 1974; Ser. No. 528,533, filed Nov. 29, 1974 now abandoned; Ser. No. 603,984, filed Aug. 12, 1975 now U.S. Pat. No. 3,986,072; Ser. No. 536,041, filed Dec. 23, 1974 now U.S. Pat. No. 3,973,964; and Ser. No. 535,780, filed Dec. 23, 1974 now U.S. Pat. No. 3,989,524; and to U.S. Pat. Nos. 3,794,873; 3,912,963; 3,894,260; 3,890,526; 3,904,914, all of common ownership herewith.

BACKGROUND OF THE INVENTION

This application concerns a radically new and improved color television picture tube of the shadow mask variety and methods for making same. As used herein, the term "shadow mask" is intended to encompass all tubes, including post deflection focus tubes, in which a color selection mask or electrode achieves a shadowing effect, whether total or only partial.

The shadow mask color television picture tube, now mass produced world-wide, emerged in the 1950's as the favorite from a group of proposed color tube types. Significant improvements occurred in rapid succession. Tube brightness, at first inadequate for all but darkened room viewing, is now sufficient for most conceivable ambient lighting conditions, due in large part to the introduction by the assignee hereof of negative guardband, black surround tubes which provided greater contrast and twice the brightness of earlier tubes. The negative guardband, black surround principle is disclosed and claimed in U.S. Pat. No. 3,146,368 issued to Joseph P. Fiore and Sam H. Kaplan and owned by the assignee hereof. Recent trends include increased rectangularity of the viewing area and a gradual change from the 90° deflection angle tube of the 1960's to the slimmer, wider angle tubes in the 1970's. In spite of the marked improvements in color tube performance over the years, significant reductions in the cost of manufacturing color tubes were achieved.

This invention is directed to the provision of a revolutionary next generation color picture tube having a novel construction and improved manufacturing methods which makes possible significant further improvements in tube performance and even lower cost of manufacture.

The manufacture of shadow mask color tubes, at least that part with which this invention is most directly concerned, involves the making of the shadow mask, the forming of the phosphor screen on the faceplate portion of a glass envelope, and the assembly of mask and screen. In the manufacture of conventional shadow mask color tubes, a flat shadow mask blank is coated on both sides with a layer of photoresist material; registered mask master stencil patterns are then contact printed on the opposed photoresist layers. After development of the photoresist layers, the blank is etched from both sides to form a pattern of mask apertures in a central region of the blank. The apertured mask blank is then "formed" by a metal stamping or drawing process to a three-dimensionally curved shape, typically a compound spherical (multi-radial) shape.

The formed shadow mask is then welded on a heavy, rigid frame. The mask assembly is ultimately suspended in a tube with the mask spaced about ½ inch from the phosphor screen of the tube; the screen takes the form of a mosaic pattern of red-emissive, blue-emissive and green-emissive phosphor element triads. The mask serves to "shadow" the phosphor screen such that each of three electron beams carrying red, blue and green color information each "see" only red, blue and green phosphor elements, respectively.

In a typical large screen color television tube, there are approximately 400,000 apertures which must be aligned exactly with a corresponding pattern of 400,000 phosphor element triads. In the manufacture of conventional color tubes, in order to assure that each mask aperture is precisely aligned with its associated triad of phosphor elements, in spite of irregularities in the mask aperture pattern (which may be introduced in the mask forming or etching processes, during handling, etc.), the shadow mask is used as a photographic stencil during the photoexposure operations employed to form the phosphor screen. Thus, in each tube, a unique shadow mask aperture pattern is replicated into the pattern of phosphor element triads which collectively constitute the phosphor screen. The same mask which was used in the photoprinting of a particular phosphor screen must, of course, be ultimately mated or "paired" with that screen. This demands that each mask follow the faceplate carrying its mating screen throughout the tube factory — a logistical bete noire.

The color television tube which has become standard, particularly in large screen sizes, has a so-called "negative guardband", "black surround" screen. In this type of screen the electron beam landings are caused, by appropriate sizing of the mask apertures and phosphor elements, to be larger than the impinged phosphor elements by an amount equal to the allotted beam landing tolerance or "guardband." This type of screen is further characterized by having black material between the phosphor elements for enhanced contrast. It is standard practice in the manufacture of such tubes to first deposit on the inner surface of the tube faceplate a black "grille," i.e., a layer of light-absorptive material having openings in which the phosphor elements are to be subsequently deposited. The black grille and three patterns of phosphor elements (red-emissive, blue-emissive and green-emissive) are deposited in succession on the faceplate by photochemical methods which involve coating a lightsensitive layer on the faceplate and exposing the layer through a uniquely associated shadow mask to a source of light actinic to the layer. Such an exposure operation is herein termed a "photoexposure" operation.

In the exposure of the photosensitive coating used to make the black grille, the coating is exposed to point or line light sources (depending on the tube type) at three locations simulating the ultimate electron beam deflection center locations. In the screening of the red-emissive, blue-emissive and green-emissive phosphor elements, a single exposure is made from a different one of the three light source locations. The proper selection of the mask-to-faceplate spacing and the location of the light sources are selected to assure the proper parallax relationship of the electron beam sources, the mask and the phosphor screen when the end-product tube is finally assembled. The necessarily large spacing of the shadow mask from the screen, however, makes it difficult to accurately form the grille openings, and thus to accurately form the phosphor elements which fill the openings, and inevitable results in undesirably long exposure times.

In tubes of the negative guardband, black surround type, as explained, the electron beam landing spots are larger than the impinged phosphor elements. Since in conventional practice the shadow mask is used as the exposure stencil during the photoexposure operations used to screen the faceplate, some method must be provided for causing the electron beam spots to be larger than the impinged phosphor elements. Two methods are employed commercially. The first is the so-called "re-etch" or "etch-back" method wherein the shadow mask apertures are originally formed to the (smaller) size of the phosphor elements, and then after the screening operations, the shadow mask is "re-etched" (etched a second time) until the shadow mask apertures are larger than the phosphor elements by the allotted tolerance value, thus producing the desired negative guardband condition.

The second method used to cause the mask apertures to be larger than the associated phosphor elements is to use a shadow mask which has full-sized apertures and, by the use of special photoreduction techniques during the photoexposure operations, to cause the phosphor elements to be smaller than the shadow mask apertures. The former method suffers from its requirement of an additional mask etching operation. The latter method is difficult to execute due to the very tight tolerances necessarily imposed during the photoreduction operations to assure the proper sizing of the phosphor elements.

OBJECTS OF THE INVENTION

It is an object of this invention to provide improved apparatus for manufacturing color tubes of the shadow mask type which make possible the interchangeability of faceplates, each with all others. It is a related object to provide improved apparatus for shadow mask color tube manufacture which does not require the unique association of the "pairing" of masks and faceplates during any tube manufacturing operations.

It is yet another object to provide improved apparatus which make possible more accurate and precise phosphor screen patterns.

Certain of the above-stated objects of this invention are common to the objects described and claimed in U.S. Pat. No. 3,676,914, issued to Joseph P. Fiore and assigned to the assignee of the present invention. Due to the nature of the process described in the Fiore patent, even though offering the promise of significant improvements in shadow mask color tube manufacturing, that approach has been found to present certain difficulties in execution.

| OTHER PRIOR ART | | | | |
|---|---|---|---|---|
| 2,870,010 | - Sadowsky | 3,701,185 | - | Van Renssler |
| 2,989,398 | - Bingley | 3,564,195 | - | Ploog |
| 3,437,482 | - Yamada et al | 3,537,161 | - | Kautz |
| 3,451,812 | - Tamura | 3,733,366 | - | Grimm et al |
| 3,563,737 | - Jonkers | 3,017,687 | - | Day |
| 3,889,329 | - Fazlin | Japanese No. | | 10853/65 |

BRIEF DESCRIPTION OF THE DRAWINGS

The features of the present invention which are believed to be novel are set forth with particularity in the appended claims. The invention, together with further objects and advantages thereof, may best be understood by reference to the following description taken in conjunction with the accompanying drawings, in the several figures of which like reference numerals identify like elements, and in which:

FIGS. 5–12 collectively constitute a flow diagram describing synoptically the manufacture of the novel tube shown in FIGS. 1–4;

FIGS. 14–25 constitute a flow diagram illustrating schematically, but in more detail than in FIG. 13, manufacturing operations used to produce a prime master useful in making a color tube as shown, for example, in FIGS. 1–4;

FIGS. 26–30 constitute a flow diagram illustrating schematically, but in more detail than in FIG. 13, operations performed in the making of intermediate mask masters;

FIGS. 31 and 32 are perspective and sectional views of an intermediate mask master made by the processes of FIGS. 26–30;

FIG. 33 is a greatly enlarged sectional view of a prime master and an intermediate mask master blank, greatly magnified and distorted for purposes of illustration, illustrating the principle of near-contact printing employed in the making of masters, shadow masks and screens;

FIG. 34–40 are perspective, plan, side elevational and sectional views of a universal exposure fixture employed in the fabrication of masters useful in the manufacture of tubes according to this invention;

FIGS. 41–45 constitute a flow diagram illustrating schematically manufacturing operations followed in making intermediate screening masters;

FIGS. 46–49 constitute a flow diagram illustrating schematically, but in more detail than in FIG. 13, operations by which a working mask master is made;

Figure 1:
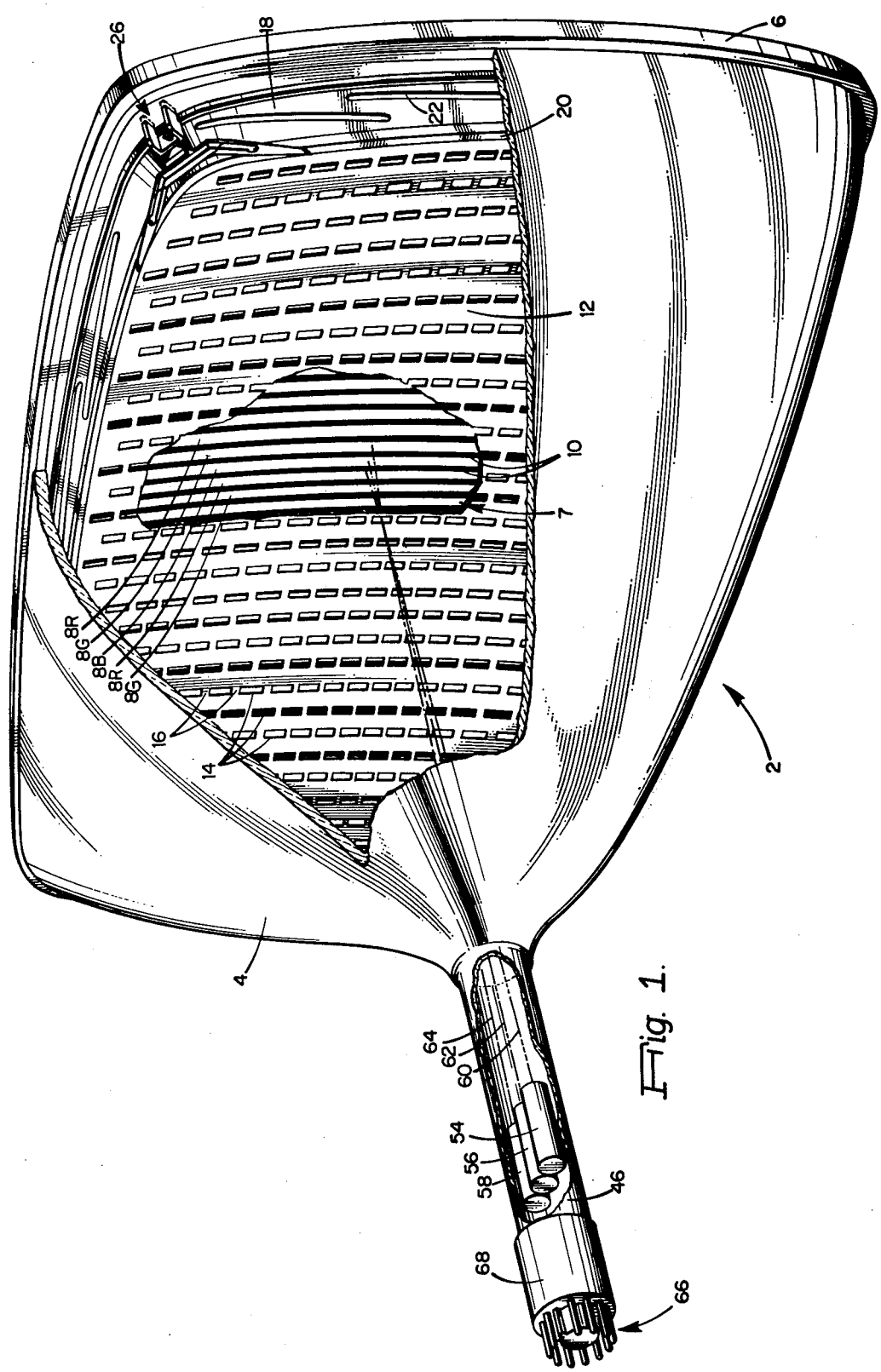
FIG. 1 is a schematic perspective view of a novel color cathode ray tube made in accordance with the teachings of the present invention; certain parts are shown in exaggerated dimension for clarity of illustration.

395,334. Briefly, the shadow mask 12 is preferably of a frameless, one-piece construction formed from a single sheet of electrically conductive material such as steel. An integral skirt 18 provides rigidity for the mask and shields the screen 7 from stray and overscanned electrons. Integrally formed ribs 22, channel 20 and edge lip 24 cause the mask 12 to be relatively stiff with respect to the major and minor axes thereof, while permitting the mask to flex with respect to its diagonals and thereby conform, when mounted, to twist deviations in the contour of the faceplate.

A suspension system of novel construction is provided for supporting the shadow mask 12 in spaced adjacency to the inner surface of the faceplate 6. The suspension system shown is not the subject of this application, being described and claimed in the referent copending applications.

The suspension system preferably comprises four suspension devices 26, one at each corner of the mask 12. As noted, the shadow mask 12 is constructed so as to be relatively rigid with respect to its major and minor axes, but less rigid with respect to its diagonals. By mounting the suspension devices 26 at the corners of the mask 12, unit-to-unit deviations in the faceplate with respect to the faceplate diagonals are followed by corresponding flexure of the shadow mask 12 so as to maintain a constant Q spacing, i.e., a constant spacing between the central apertured portion of the shadow mask 12 and the inner surface of the faceplate 6 carrying the phosphor screen 7.

Although numerous other arrangements are contemplated, in the illustrated preferred suspension system, the suspension devices 26 each comprise a bracket 28 mounted on a corner of the mask which carries a leaf spring 30 which is relatively weak, but laterally stiff (in its own plane and in torsion). The spring is shown as having an X corrugation embossed in its face to increase the spring rate, however, the spring 30 may be provided without the corrugation. The spring 30 carries on its distal end a lug 32 which is received within a lug-receiving opening 34 in a faceplate-mounted stud 36 when the mask 12 is mounted in its operative position on the faceplate 6. Alternatively, the lug 32 may be formed integrally with the spring 30. The bracket 28 has embossed therein stiffening corrugations 38, and, if thermal compensation is necessary, may be made of a side-bonded bimetal so constructed and configured that when the mask 12 heats and expands due to electron bombardment, the bracket 28 deflects and brings the shadow mask closer to the phosphor screen by an amount necessary and sufficient to compensate for the mask expansion.

The stud 36 has a channel shape with a forwardly extending face 40 containing the lug-receiving opening 34 and two legs 42, 44 which are embedded in (or which may be cemented to) the faceplate 6. The spaced legs 42, 44 permit screening fluids suffused across the faceplate to pass through the stud 36 without clogging it.

The lug-receiving openings 34 in three of the four studs 36 are circular or triangular and define the location of the mask 12 relative to the faceplate 6. The lug-receiving opening 34 in the redundant fourth stud 36 is preferably elongated in a direction parallel to the inner surface of the faceplate 6, permitting the fourth lug to seek an equilibrium position and preventing disturbance of the mask position which is determined by the other three studs 36. To insert or remove the mask 12, the springs 30 are depressed until the lugs 32 clear the lug-receiving openings 34 in the studs 36.

As shown in FIG. 1, the tube 2 has a neck 46 within which is contained an electron gun assembly. The electron gun assembly may take any of a variety of constructions, but in the illustrated embodiment wherein the mask is a slot mask cooperating with a screen to the "line"-type, the electron gun assembly preferably is of the "in-line"-type, wherein three separate guns 54, 56, 58 generate three coplanar beams 60, 62, 64 intended to carry, respectively, red-associated, blue-associated and green-associated color video information. The electron gun assembly is electrically accessed through pins 66 in the base 68 of the tube.

Tube Manufacture: Overview – FIGS. 5–12

Novel methods for manufacturing tubes such as tube 2 will now be described. However, before engaging in this detailed description, it will be useful to again allude to the conventional practices for making standard shadow mask-type color tubes. According to conventional practice, the shadow mask assembly is made before the faceplate is screened and the shadow mask is used as a photographic stencil during the photochemical deposition of the screen on the faceplate. Each mask, being different in its aperture pattern from all others, must be uniquely paired to a particular faceplate during the screen photoexposure operations and thereafter in order to assure correspondence between mask aperture patterns and phosphor patterns in the assembled tubes. As will be noted in the following description, the pairing of masks 12 and screen-bearing faceplates 6 is obviated by the present method, the masks being made in one manufacturing process and the faceplates being screened in a separate process, the masks and screened faceplates being mated at a tube final assembly point.

A synopsis of the novel manufacturing methods and structures with which this invention is involved will be obtained from the following description of the FIGS. 5–12 flow diagram. After a brief description of each step in the FIGS. 5–12 flow diagram, an elaboration of each step will be undertaken.

In FIG. 5 a formed mask blank 69 is intended to represent a series of processing steps in which a shadow mask blank is prepared and metal-formed to have the afore-described three-dimensionally curved configuration with peripheral rigidifying and electron shielding structures. Unlike conventional mask manufacturing processes wherein the aperture pattern is created before the mask blank is metal-formed, in the present method the mask blank is formed before the mask aperture pattern is etched in it.

FIG. 6 represents a sequence of processing steps wherein mask suspension elements 70 are mounted on the mask blank 69 and a layer 71 of photoresist (a photosensitive etchant-resistant material) is deposited on the concave side of the formed mask blank 69.

FIG. 7 represents processing steps wherein a mask master 96, derived in a master generation process 77 (see FIG. 7A – to be described in detail hereinafter), is supported adjacent the concave surface of the mask blank 69 and the photoresist layer 71 exposed to a source 72 of ultra-violet radiation. The exposed photoresist layer 71 is developed to create a pattern of openings in the photoresist layer in the locations in which apertures are to be formed in the mask blank 69.

Figure 62:
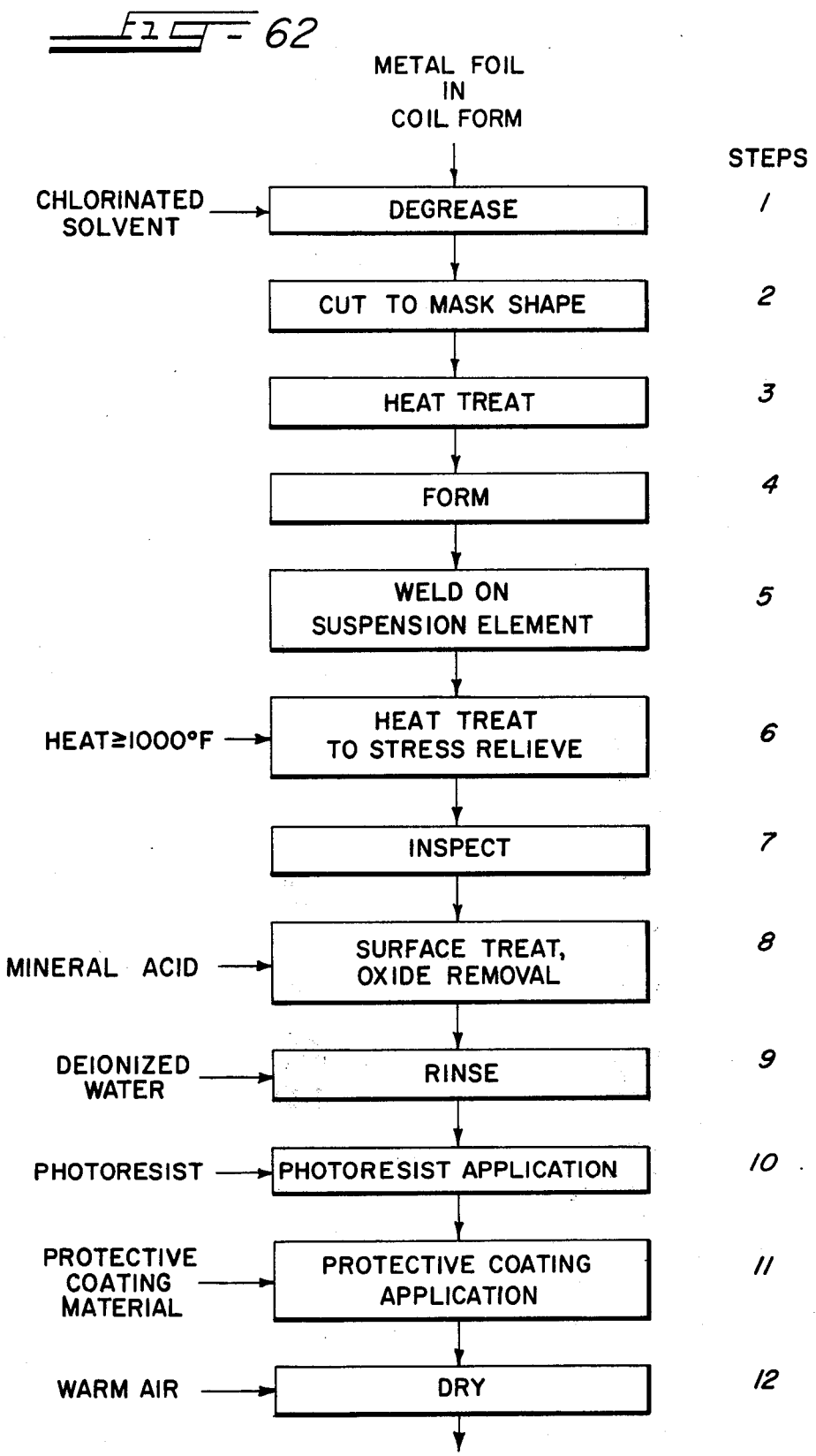
Figure 66A:
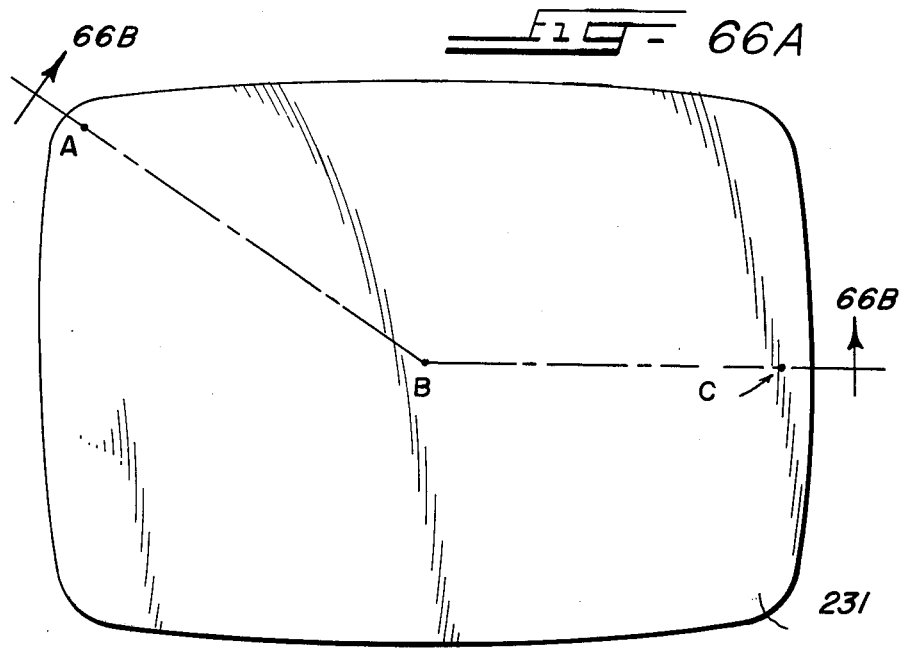
Figure 66B:
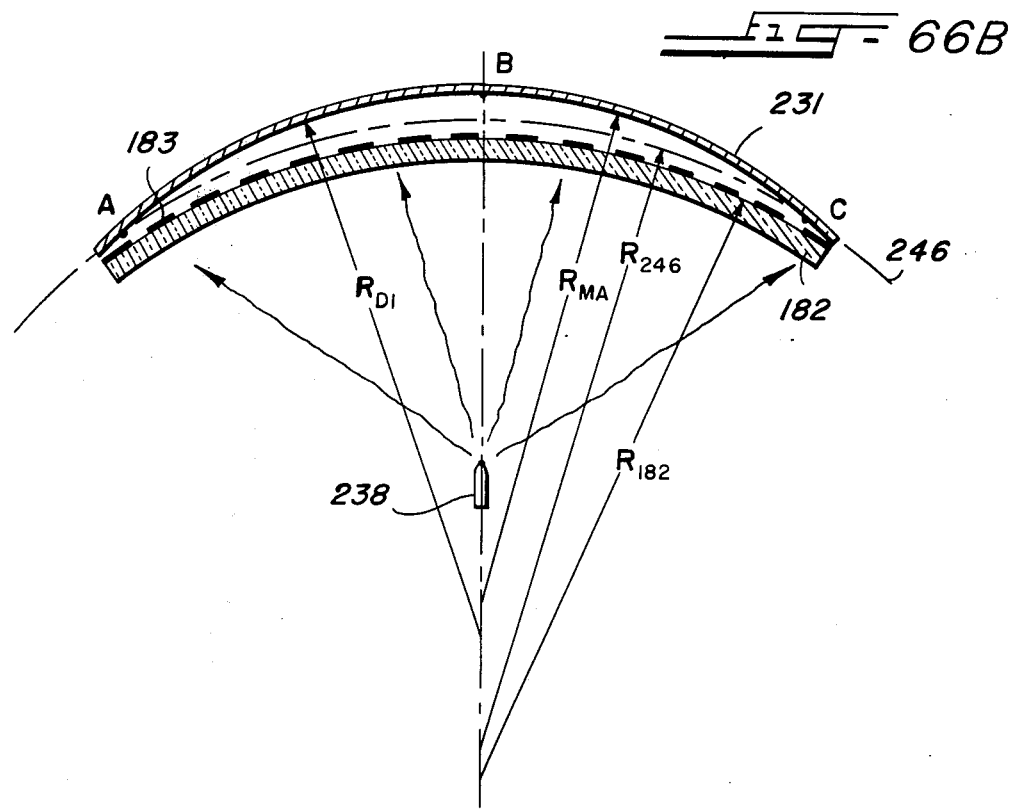

FIG. 50 schematically illustrates a lighthouse for exposing a photosensitive coating on the convex side of a curved substrate;

FIGS. 51-54 constitute a flow diagram illustrating schematically operations for making a working screening master;

FIG. 55 is a perspective view of one of four working screening masters constructed according to this invention and used in the photochemical formation of phosphor screens;

FIG. 56 is a sectioned, side elevational view of the FIG. 55 working screening master;

FIGS. 57-60 are enlarged views of a portion of the master stencil patterns carried by the four FIG. 55 working screening masters; the portion shown is that circled in FIG. 55;

FIG. 61 is an enlarged, cross-sectional view of apertures in the center region of a shadow mask;

FIG. 62 is a flow diagram depicting operations involved in making a shadow mask;

FIG. 63 is a view which depicts very schematically the results of a particular one-sided etching process for etching a preformed shadow mask;

FIGS. 64-65 are views of the convex and concave sides of the shadow mask shown in FIG. 63;

FIG. 66 is an elevational view of lighthouse apparatus including a working mask master for photoexposing a mask blank coated with a photosensitive layer;

FIGS. 66A and 66B are schematic diagrams illustrating the principle of near-contact exposure as applied, under certain conditions, to the photoexposure of mask blank 231;

FIGS. 67-70 are views of lighthouse apparatus for photoexposing faceplates being screened;

FIGS. 71-76 are side sectional and plan views of a working mask master and two working screening masters (phosphor pattern and grille); these figures illustrate the relative size relationship of the master stencil pattern elements in these patterns and the way in which the negative guardband condition in the end-product screen and associated shadow mask is achieved;

FIGS. 77-79 show how interchangeability of masks and faceplates is assured in spite of irregularities in these interchangeable components; and FIGS. 80-82 are views of a color tube faceplate assembly and funnel which depict the structures for referencing these tube components to each other.

DESCRIPTION OF THE PREFERRED EMBODIMENTS
SECTION HEADING INDEX
(Listed in the Order of Their Appearance)

| HEADING | FIGURE REFERENCES |
|---|---|
| The Tube Structure | 1-4 |
| Tube Manufacture: Overview | 5-12 |
| Master Generation Process: Overview | 13 |
| Prime Master Generation | 14-25 |
| Intermediate Master Generation | 26-45 |
| The Intermediate Mask Master 90 | 31-32 |
| The Near-Contact Printing Principle | 33 |
| The Exposure Fixture 124 | 34-40 |
| Intermediate Screening Master Generation | 41-45 |
| Working Mask Master Generation | 46-49 |
| Convergent Center-of-Deflection Lighthouse | 50 |
| Working Screening Master Generation | 51-54 |
| The Working Screening Masters | 55-60 |
| Shadow Mask Manufacture | 61-65 |
| Photoexposure of the Mask Blank 231 | 66, 66A and 66B |
| Screening of the Faceplate 6 | 9-10 |
| Screening Lighthouse 260 | 67-70 |
| Simplified Negative Guardband Process | 71-76 |
| On-Axis Screening Photoexposure | — |
| Aluminization and Final Assembly | 11-12 |
| The Interchangeability and Interregistrability of Masks and Faceplates | 77-82 |

*(The present invention)

The Tube Structure – FIGS. 1-4

FIGS. 1-4 illustrate a shadow mask-type color tube 2 made according to this invention. It is noted at this point that the tube is readily adaptable to non-interchangeable manufacture, i.e., it may be made by the conventional method of pairing a shadow mask with a particular screen throughout at least the screening and subsequent tube fubrication operations. As state above, however, in the preferred execution of this invention, the tube's shadow mask is caused to be interchangeable, each with all others, as are the screened faceplates. The nature, advantages and implementations of this objective will be described in detail below.

The illustrated tube 2 is shown as having a novel envelope comprising a funnel 4 sealed to a flangeless faceplate 6. Unlike conventional faceplate structures, the novel construction of the faceplate 6 without a flange permits economies in manufacture of the envelope and simplified and economical screening processes, as will be explained hereinafter.

On the inner surface of the faceplate 6 is disposed a phosphor screen 7. Whereas the screen 7 may take any of a wide variety of other configurations such as the conventional dot screen configuration, in the illustrated embodiment it is shown as comprising an array of vertically oriented, horizontally repeating triads of red-emissive, blue-emissive and green-emissive phosphor elements 8R, 8B and 8G. The screen is preferably of the negative guardband, black surround-type as taught to the world in the above-mentioned patent to Fiore et al, U.S. Pat. No. 3,146,368. A black grille 10 comprises, in this embodiment, a pattern of light-absorptive bands separating the phosphor elements 8R, 8B, 8G.

A shadow mask 12 of novel construction, described below, has formed therein a pattern of apertures 14. Whereas aperture patterns of other types may be employed, the mask 12 is shown as having an aperture pattern of the so-called "slot"-type in which the apertures 14 have the form of rectangular slots arranged in vertically oriented rows, each slot in a row being separated from its neighboring slots by a "tie bar" 16.

In order to establish the desired negative guardband condition, the width of the mask apertures 14 is caused to be such that the electron beam landings 15 on the phosphor elements 8R, 8B, 8G are wider than the impinged phosphor elements by an amount equal to an allotted (negative) guardband.

The phosphor screen 7 and the method of its manufacture will be described at length below. The shadow mask construction is not the subject of this invention, being described and claimed specifically in the referent copending applications Ser. No. 285,985 and Ser. No.

FIG. 8 represents processing steps by which the mask blank 69 is etched to form a pattern of mask apertures therein, and in which the photoresist layer 71 is stripped and the resulting mask 12 prepared for final assembly in a tube.

FIG. 9 represents processing steps by which a black surround or "black grille" 10 is photochemically deposited on the inner surface of a faceplate 6 by the use of a black grille screening master 100 derived in the master generation process 77 alluded to above.

FIG. 10 represents a series of three screening processes in which patterns of red-emissive, blue-emissive and green-emissive phosphor elements 8R, 8B, 8G are deposited in succession in the openings in the black grille 10 previously formed on the inner surface of the faceplate 6. These three screening operations also employ screening masters, shown collectively as 102–106, developed in the master generation process 77 which is employed to produce the black grille screening master 100 and the mask master 96. The present invention is directed to the structure of the screening masters 100, 102, 104 and 106 which will be described in detail hereinafter.

FIG. 11 represents a process by which a layer 80 of metal, typically aluminum, is deposited on the screened faceplate 6, the aluminum layer 80 serving, as is well known, as an electrically conductive electrode for receiving the beam accelerating voltage (the screen or "ultor" voltage) and as a mirror for reflecting light emitted by the phosphor elements forwardly to the viewer.

FIG. 12 represents the final processing and assembly steps by which the mask 12 is attached to the completed screened faceplate 6, the faceplate 6 is sealed to the funnel 4, the electron gun (not shown) is inserted into the neck of the tube, the tube is evacuated, and assembly is otherwise completed.

Master Generation Process: Overview – FIG. 13

Interchangeability of masks and of faceplates is made possible by the development from a common source of artwork, hereinafter termed an artwork master, a prime master from which a family of interregistrable intermediate mask and screening masters is spawned. From the intermediate mask and screening masters there is produced a set of working mask and screening masters suitable for use in the mass production of tubes.

Figure 13:
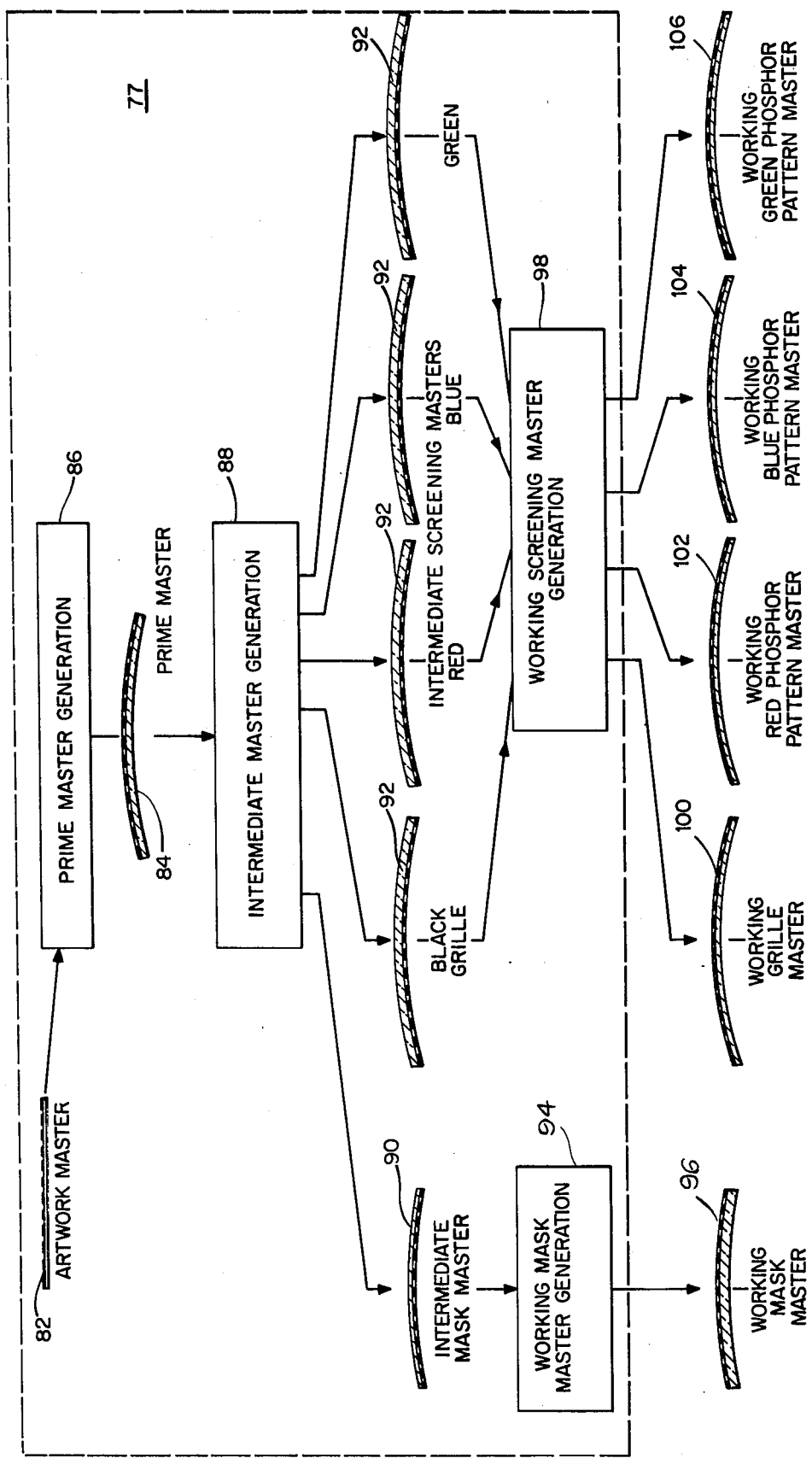
FIG. 13 is a flow diagram depicting in more detail than in FIGS. 5–12 the generation of mask and screening masters useful in the manufacture of the tube.

In more detail, there is shown in FIG. 13 an artwork master 82 having thereon a pattern which serves as the progenitor of the mask aperture pattern and phosphor screen pattern. The artwork master 82 may take the form of a flat, transparent, high resolution photographic plate on which has been recorded a precision density image representing the desired prime master stencil pattern. From this flat artwork master 82 a three-dimensionally curved prime master 84 is made, the process being represented schematically in FIG. 13 as prime master generation process 86. The prime master generation process 86 will be described in more detail hereinafter in connection with FIGS. 14–25.

As represented in FIG. 13 at 88, using the prime master 84, an intermediate mask master 90 and a series of intermediate screening masters 92 (red phosphor pattern, blue phosphor pattern, green phosphor pattern and black grille) are formed. Each of these masters is interregistrable with all others, that is, their respective stencil patterns can be made to align, element for element (considered with reference to an electron beam trajectory), within predetermined misregistration tolerance limits. The processes for making the intermediate mask master 90 will be described hereinafter (FIGS. 26–30); the processes for making the intermediate screening masters 92 will also be described, particularly with reference to FIGS. 41–45.

As depicted in FIG. 13 at 94, and as detailed in FIGS. 46–49, with the use of the intermediate mask master 90, one or more working mask masters 96 suitable for factory usage are made. In a counterpart operation, represented schematically in FIG. 13 at 98 and detailed in FIGS. 51–54, using the intermediate screening masters 92, there is made one or more working grille masters 100, working red phosphor pattern masters 102, working blue phosphor pattern masters 104 and working green phosphor pattern masters 106. As mentioned, the structure of these screening masters 100–106 is the subject matter of this invention. See FIGS. 55–60 below and the associated text for a description of same. As will also be explained in detail below, since the working mask masters 96 and the working screening masters 100–106 are each derived from the prime master 84, the master stencil patterns contained on these masters are all interregistrable and represent either positive or negative duplicates of the master stencil pattern carried by the prime master 84; these duplicates may be of either positive or negative polarity as the nature of the chosen process dictates.

Prime Master Generation – FIGS. 14–25

The prime master generation process 86 will now be described in detail. Whereas other processes are contemplated, one satisfactory method for making the prime master 84 is depicted schematically in FIGS. 14–25. The artwork master 82, hereinafter termed the preliminary artwork master, comprises a photosensitive layer 105 on a stable substrate 107 (such as glass or chromium-coated glass) on which layer has been recorded an artwork master pattern as shown, e.g., in FIG. 15, comprising rows of slots 99 separated by tie bars 101. Two-dimensional X–Y pattern generators capable of recording precise geometrical patterns on photographic emulsions are readily available commercially and routinely produce artwork having the necessary high resolution.

The preliminary artwork master 82 may have any desired pattern on it, depending upon the type of the end-product tube (slot mask, dot mask, etc.), on the nature of the photoresists and photoexposure operations subsequently involved, and on many other factors. The polarity of the pattern may be either positive or negative relative to the polarity of the end-product mask and screen patterns, depending upon the nature of the subsequent operations and structures.

For reasons which will become evident from the description to follow, the pattern on the preliminary artwork master 82 is transferred, as by a contact printing operation (represented schematically by FIG. 16), to a flexible recording medium. The flexible recording medium may be Kodalith (trademark of Kodak Corporation), Ortho film 2556, Type S, Estar (trademark of Kodak Corporation) base, 0.004 inch thick. The resulting flexible artwork master 109 is placed in a vacuum-forming fixture, shown schematically as 108, in which the artwork master pattern thereon will be transferred to the convex surface of a prime master blank 110 (see FIG. 17). Heat may be applied in the fixture 108, when necessary, to achieve intimate contact everywhere between master 109 and blank 110.

The prime master blank 110 (see FIG. 18) preferably takes the form of a highly polished glass element having a curvature corresponding to the curvature of the end-product shadow mask 12 (bi-radial, for example). Alternatively, in the interest of economy, but at some sacrifice in performance of the end-product tube, the prime master blank 110 may have a spherical curvature which represents an approximation to a bi-radial curvature. As used herein, a "bi-radial" surface configuration is one which has different predetermined radii on the major and minor axes and transitional curvatures in the surface regions between the major and minor axes. For example, a bi-radial shadow mask for a 19 inch (diagonal) tube may have a major axis radius of 30.750 inches, a minor axis radius of 33.900 inches and diagonal radii of 31.250 inches. A durable, optically opaque coating 111 (see FIG. 19) such as chromium, iron oxide or other suitable stencil material is deposited on the blank 110. The coated prime master blank is shown in FIG. 20.

The coated blank 110 is inserted in a suitable fixture 112 and precision mounting elements 114 (here shown as spheres), for use in precisely locating the prime master 84, are attached to the prime master blank 110. A photoresist layer 115 is applied over the stencil material coating 111 and the photoresist layer 115 is baked (see FIG. 22). The coated blank 110 is inserted in the fixture 108. By the application of heat (if needed) and vacuum, the flexible artwork master 109 is drawn down tight on the blank 110 and the photoresist layer 115 is exposed to UV (ultra-violet) radiation (FIG. 17). After exposing the photoresist layer 115 through the artwork master 109, the artwork master 109 is removed and the photoresist layer 115 developed.

It should be understood that throughout the discussion of this process and other photochemical deposition processes to be described, the relevant master can be of either positive or negative polarity and the associated photoresist can be appropriately either positive-working or negative-working. In certain photoexposure operations, as will be described, it will be more desirable to have a master of one polarity than the other or a photoresist of one type rather than the other. As shown in FIG. 15, the artwork master 82 is a positive representation of the shadow mask slot pattern. The pattern on the flexible artwork master 109 is preferably a positive of the pattern on master 82. The photoresist layer 115 applied on the prime master blank 110 is preferably of the positive-working type in order that the layer 115, when developed, will have openings corresponding ultimately to the location of the openings in the shadow mask.

The photoresist development step is shown in FIG. 23. As shown schematically in FIG. 24, the coating 111 of opaque stencil material is then etched through the openings in the photoresist layer 115 and the photoresist layer subsequently stripped. The resulting finished prime master 84 has formed thereon a prime master stencil pattern 117 (FIG. 25). The prime master 84 is useful in the spawning of a family of interregistrable intermediate mask and screening masters, as discussed in detail hereinafter.

Intermediate Master Figures

A flow diagram depicting a process for making an intermediate mask master 90 is shown in FIGS. 26–30.

An early step in the generation of an intermediate mask master 90 is the provision of an intermediate mask master blank 116. The blank 116 may take various forms but preferably comprises a torsionally flexible, highly polished, three-dimensionally curved glass element. The curvature of the blank 116 corresponds to that of the prime master 84.

The concave surface of the blank 116 is coated with a layer 120 of durable, optically opaque stencil material such as iorn oxide or chromium. After deposition of the layer 120, which may be by any of a number of appropriate conventional material deposition techniques, a frame 119 with attached mounting elements 121 is mounted on the blank 116, as shown schematically in FIG. 27. For reasons which will become clear as this description proceeds, the mounting element 121 preferably simulates the mask-mounted components of the mask suspension devices 26 shown in FIGS. 1–4.

A suitable photoresist coating 122 is applied to the concave surface of the blank 116 over the opaque layer 120 and baked. The coated blank 116 is placed in an exposure fixture 124 constituting part of a lighthouse 125. The exposure fixture 124 is a multi-purpose fixture and will be described in detail below particularly with reference to FIGS. 34–40. Preferably, the fixture 124 is adapted to be mounted on top of, or incorporated into, the upper part of an otherwise conventional lighthouse. The fixture has mounting means, hereinafter termed a "kinematic" mounting means, for holding prime master 84 such that the master 84 is repeatably positionable in an exact location within the fixture, and yet is permitted to thermally expand and contract without moving off center or otherwise shifting in position. This kinematic mounting means will be described in detail below; it is shown schematically in FIG. 28 as posts 126a, 126b with V-grooves for holding the mounting elements 114 (here shown as spheres) affixed to the prime master 84. As will be explained below, the V-grooves in the posts 126a, 126b are, in fact, oriented radially toward the lighthouse axis and angled 120° apart.

The fixture 124 contains means for supporting the intermediate mask master blank 116 in a precise location relative to the prime master 84. The means for accomplishing this precise mounting of the intermediate master blank 116 will be described in detail hereinafter, being shown schematically in FIG. 28 simply as holes in supports 142c, 142d which receive the mounting elements 121 on the frame 119 of the intermediate mask master blank 116. The holes in practice would be made to stimulate the lug-receiving openings 34 in the studs 36 shown in FIGS. 1–4. The fixture 124 has provisions for mounting other structures, as will be described in more detail hereinafter.

After positioning of blank 116 and prime master 84 in the fixture 124, a UV (ultra-violet) light source 127 in the lighthouse 125 is energized. The source 127 is positioned at the simulated location of the apparent center-of-deflection of the electron beams in an end-product color cathode (corrected for master glass refraction errors). The desired effect of this positioning is to cause the exposing light to have a directional characteristic which simulates the directional characteristic of electron trajectories in the mask-faceplate region of an endproduct tube. Light rays propagating from the light source pass through the prime master stencil pattern 117 on the prime master 84 and expose the light sensitive photoresist coating 122 on the concave surface of the intermediate mask master blank 116. As described above, the prime master stencil pattern 117 is preferably a positive image of the electron-transmissive aperture pattern desired to be formed in the end-product shadow masks. As will be shown hereinafter, it is desirable that a positive image of the prime master stencil pattern 117 be formed on the concave surface of the intermediate mask master 116. Accordingly, the photoresist material used to form the coating 122 is preferably of the positive-working type.

As will be recalled, the tube whose manufacture is being described is of the negative guardband type. In the context of a slot mask tube, this means that the slots (apertures 14 in FIG. 2) in the mask are wider than the associated phosphor strips (elements 8R, 8B, 8G in FIG. 2) by an amount equal to the allotted guardband. It is thus necessary that the mask apertures be made wider than the phosphor elements. Since a sole prime master 84 is to serve as the genesis of both the working mask masters 96 and working screening masters 100-106 (FIG. 13), some provision to effect this desired size differential must be made.

A number of different approaches are possible to accomplish this objective. One approach is to employ a prime master 84 having a stencil pattern 117 in which the pattern elements correspond in size to the ultimate mask aperture size. This necessitates effecting a pattern element size reduction in the pattern transfer from the prime master 84 to the working screening masters 100-106.

Alternatively, a prime master 84 may be employed which has a stencil pattern 117 with pattern elements of a size to correspond to the (smaller) size of the phosphor elements. This latter approach, the one to be described here, then involves effecting an enlargement of the pattern element size in the pattern transfer from the prime master 84 to the working mask master 96. This enlargement may be accomplished in many ways but is here shown schematically as being accomplished by effecting a slight movement during exposure of the kinematic prime master mount (posts 126a, 126b in FIG. 28) in a direction orthogonal to the direction of orientation of the apertures 14 and phosphor elements 8R, 8B, 8G. This may be accomplished by moving the master 84 continuously during exposure or in a step-and partially-expose fashion. The movement may be provided by using a conventional translation table on which four posts like 126a (one in each corner) are mounted. The Y direction of movement is not necessarily used in the manufacture of slot mask tubes, but would be used in the manufacture of dot mask and other types of tubes having two-dimensionally varying screen patterns.

The amount of movement effected would be only that necessary to widen the exposed slot-related areas on the photoresist coating 122. For example, if the slot-related pattern elements on master 84 have a width of 10 mils and it is desired to create a mask aperture of 12 mil width, the master 84 would be shifted side-to-side to expose slot-related areas of the photoresist coating about 12 mils wide.

After exposure of the photoresist coating 122, the blank 116 is removed from the fixture 124 and the exposed photoresist coating 122 is developed and etched, an operation depicted in black box form in FIG. 29. If the opaque layer is formed from iron oxide, the etchant may be 700 ml. of HCl (37%), 200 ml. of $H_2O$, and 100 grams of $FeCl_2 \cdot 4 H_2O$. The photoresist material is preferably Shipley AZ-1350 J. If the opaque layer is chromium, for example, it is preferred that the etchant be 164 grams of $((NH_4)_2 Ce(NO_3)_6)$, 90 ml. of $HNO_3$ (70%), and 900 ml. of $H_2O$ and the photoresist be Shipley AZ-1350 J.

After the etching and associated rinsing, drying and other necessary operations are performed, a finished intermediate mask master 90 results. See FIG. 30. Use of the intermediate mask master 90 to generate a finished working mask master for use in a factory environment will be described below in connection with FIGS. 46-49. A more structuralized illustration of the intermediate mask master 90 can be seen in FIGS. 31 and 32, to be described.

The Intermediate Mask Master 90 – FIGS. 31-32

The intermediate mask master 90, for reasons which will become evident, is preferably caused to be capable of flexing about its diagonals in the manner of shadow mask 12.

Figure 2:
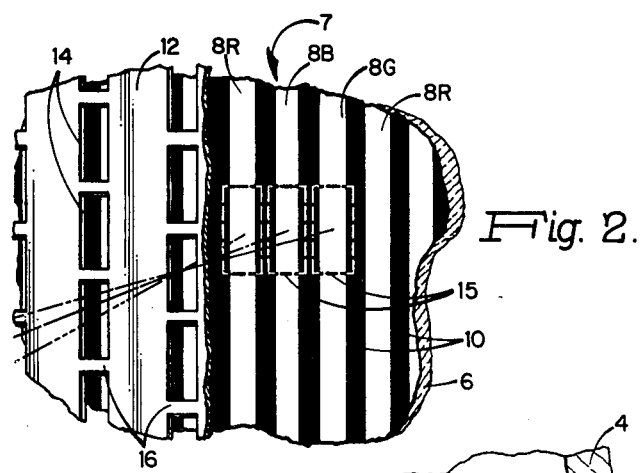
FIG. 2 represents an enlargement of a portion of the FIG. 1 tube.
Figure 3:
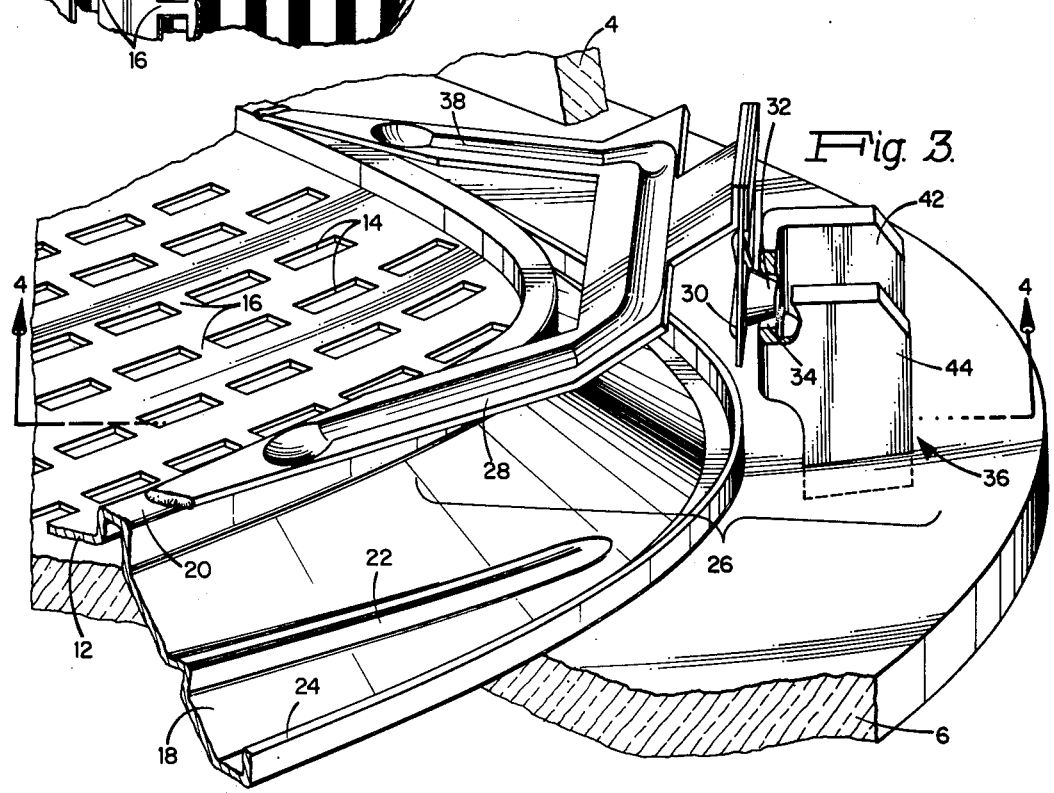
FIG. 3 is an enlarged fragmentary perspective view, shown partially sectioned and broken away, of a corner of the tube shown in FIG. 1, revealing with particular clarity one of the suspension elements for mounting the shadow mask in the tube faceplate.
Figure 4:
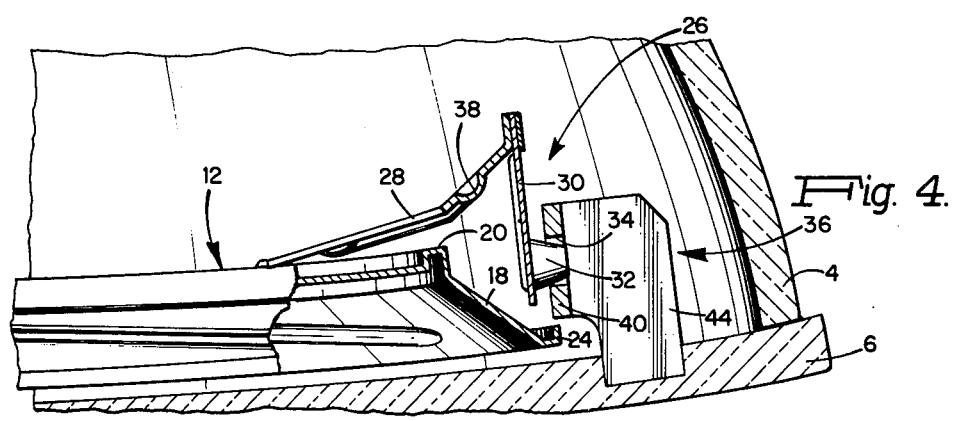
FIG. 4 is a section view taken generally along lines 4—4 in FIG. 3.

As described above, the intermediate mask master stencil pattern (130 in FIGS. 31 and 32) resembles the prime master stencil pattern 117, except that the pattern elements corresponding to mask slots are wider in the direction of electron beam scan than the corresponding elements of the prime master stencil pattern 117 (see FIG. 15) in order to provide the desired negative guardband on each side of the phosphor elements 8R, 8B, 8G (see FIG. 2). To this end, the intermediate mask master preferably comprises a highly polished glass substrate 128 which is quite thin and flexible, for example about 100 mils thick. See FIGS. 31 and 32. The concave surface 129 of the substrate 128 contains the intermediate mask master stencil pattern 130. The contour of the substrate 128 corresponds to the contour of the end-product mask (preferably bi-radial). If, in the interest of economy, the prime master 84 is spherical, the substrate 128 may have a corresponding spherical contour.

In order to simulate the mounting means on a shadow mask 12, the intermediate mask master 90 preferably has mounting elements and a rim structure which closely resembles in their mechanical properties the mask mounting elements and the mask rim structure. The intermediate mask master 90 is shown as having a frame 131 formed integrally in one piece from a sheet of a material similar to that used to make the shadow mask 12 and includes a stiffening channel 132, a skirt 133 and a stiffening lip 134 which closely resemble the corresponding structures in the shadow mask 12.

Four corner-located mounting elements 135 may each comprise a bracket 136 and a spring 137 which duplicate the bracket 28 and spring 30 used to suspend the shadow mask 12. Bracket 136 need not be of bimetallic construction since temperature compensation of the master 90 is not necessary. Spring 137 on the bracket has a lug 138 corresponding to lug 32 in FIGS. 1-4.

The Near-Contact Printing Principle – FIG. 33

Before proceeding further, an elaboration on an aspect of the afore-described photochemical transfer of the prime master stencil pattern 117 to the intermediate mask master 90 will be undertaken. In particular, the positional relationship of the prime master 84 to the intermediate mask master blank 116 is such as to achieve high fidelity of the image transferred while also making possible a short exposure time. To this end, the convex surface of the prime master 84 and the addressed concave surface of the intermediate mask master blank 116 both are caused to have curvature corresponding to each other and to the curvature of the end-product shadow mask which may be spherical, but preferably is bi-radial. Although the results may not be optimum, the intermediate mask master blank 116 and prime master 84 may have addressing surfaces which have corresponding sphericity even though the end-product mask is only approximately spherical (bi-radial, e.g.). The addressing surfaces of the blank 116 and master 84 are caused to be supported by the exposure fixture 124 in very closely spaced but non-contacting relationship during the photoexposure of the photoresist coating 122. By supporting the prime master 84 and the intermediate mask master blank 116 in non-touching relationship during exposure, the light image (of the prime master stencil pattern 117) formed on the coating 122 is undegraded by any deformation of either the blank 116 of the master 84 which might result if the blank 116 and prime master 84 were permitted to touch during exposure. Any deformation of either the master 84 or the blank 116 would result in a distortion of the transferred master pattern. The afore-described exposure principle and the related photoprinting operation is herein collectively termed "near-contact photoprinting" and the exposure step alone is given the short-hand appellation "near-contact exposure."

As an added benefit of the near-contact exposure of the prime master stencil pattern 117 onto the intermediate mask master 90, the exposure time required to expose the photoresist coating 122 is substantially reduced over what it would be if the exposure operation were carried out at a greater distance, as in the conventional photoprinting of phosphor screens using a shadow mask as the master. Reduction in exposure time results from the fact that due to the very close spacing of the prime master 84 from the blank 116, the penumbra-induced spreading of the transferred image is minimized. A larger area light source (with proportionately greater luminous output) may thus be employed without increasing the degree of penumbra effect.

The nature of the near-contact photoprinting principle will be better understood by reference to FIG. 33 which illustrates the prime master 84 and the intermediate mask master blank 116 in greatly enlarged size. The concave surface of the intermediate mask master blank 116 is shown to deviate (exaggerated) from a nominal curvature, shown by the broken line NC1, by a tolerance value ±A. The convex surface of the prime master 84 is shown as deviating (also exaggerated) from a nominal curvature, as represented by the broken line NC2, by a tolerance value of ±B. In order to insure that the prime master 84 and intermediate master blank 116 are held in the afore-described close but non-contacting relationship, the spacing of the prime master 84 from the intermediate mask master blank 116 is caused to be slightly greater than A + B, that is, slightly greater than the sum of the maximum tolerance values assigned to the surface configurational deviations of the prime master 84 and the intermediate mask master blank 116. By way of example, if it is assumed that the prime master tolerance value A is ± 5 mils and intermediate mask master tolerance value B is ± 10 mils, the nominal spacing of the prime master 84 from the master blank 116 should be between about 16 and 50 mmils, preferably about 25 mils.

As will become evident as this specification proceeds, the described near-contact exposure principle is employed at numerous points throughout the tube manufacturing process being discussed; in each case the principle is the same. The above description was made with reference to the photoprinting of the prime master stencil pattern 117 onto the intermediate mask master blank 116 only by way of giving a concrete illustration, but it should be understood the near-contact exposure principle is general in its applicability.

Before resuming a discussion of the master generation processes, and in particular the processes for generating the working mask master 96 and the working screening masters 100–106, a brief description of the universal exposure fixture 124 will now be made, particularly with reference to FIGS. 34–40.

The Exposure Fixture 124 – FIGS. 24–40

The exposure fixture 124 has a number of uses in the method of manufacturing tubes under discussion. As described above in connection with FIGS. 26–30, the fixture 124 is used to replicate the prime master stencil pattern 117 onto the concave inner surface of intermediate mask master 90. Fixture 124 will be hereinafter described as useful in the manufacture of intermediate screening masters (see 92 in FIG. 13), in the making of working mask masters (see 94, 96 in FIG. 13) and in the making of working screening masters (see 98, 100–106 in FIG. 13). As will be described in more detail much later herein, by the use of a common fixture, interregistrability of the working mask master and the working screening masters, and thus interchangeability of masks, each with all others, and interchangeability of faceplates, each with all others, is assured.

In the ensuing description, certain reference numerals which have been used to denote structure shown schematically in FIG. 28 will be used also to denote corresponding actual structure in FIGS. 34–30. The exposure fixture 124 is illustrated as comprising part of a lighthouse 125. In practice the fixture 124 is constructed as a separable component which may be removed for use in different lighthouse structures.

The fixture 124 includes a table 139 on which is supported three posts 126a, 126b, 126c which perform the function attributed to posts 126a, 126b in FIG. 28. These posts 126a, 126b, 126c collectively constitute a kinematic mount for supporting the prime master 84, as heretofore described. The V-grooves 140a in the top of the posts are each oriented toward the central axis of the fixture, that is to the axis passing through the center of any master or master blank mounted on the fixture. By this arrangement, thermal expansion of the mounted element will not produce a shift in its center.

As mentioned above, it is desirable that the prime master 84 be caused to move during exposure, at least along the X-axis of the screen in a slot mask context, in order to cause the mask apertures (slots in the embodiment under discussion) to be wider in the direction of electron beam scan than the associated phosphor elements. To this end, the posts 126a, 126b, 126c are mounted on a translatory frame 140 which can be adjusted in its movement along the X-axis by means of a micrometer adjustment device 141. To assure that the frame 140 translates linearly in the X direction without any roll, pitch or yaw, the frame 140 is provided with balls 141a which travel in V-grooves 141b, oriented parallel to the X-axis, in the upper surface of the table 139. During exposure of the intermediate mask master, the frame 140 may be varied during the photoexposure operation in a step-and-repeat fashion by adjustment of the micrometer adjustment device 141 to widen the exposure, slot-related areas on the photoresist coating 122.

The frame 140 is readily adjustable, in this application in the X (horizontal) dimension; its travel range is about ± 0.050 inch, with a repeatability of about ± 0.0001 inch. Rather than using the frame/micrometer arrangement shown, this translational movement could also be accomplished with slide and shim stops, or with an electromechanical translation stage.

In order to support the intermediate mask master 90, and subsequently to support shadow masks during formation of aperture patterns therein (to be described hereinafter), there is provided at the four corners of the table 139 supports 142a, 142b, 142c, 142d, each support having a lug-receiving opening 143 for receiving a lug on an intermediate mask master 90.

As will be described in more detail hereinafter, fixture 124 is also provided with a second set of kinematic mounting posts 144a, 144b, 144c affixed to the table 139 for supporting an intermediate screening master 92. The mounting posts 144a, 144b, 144c have V-grooves 149 similar to the V-grooves 140a on posts 126a, 126b, 126c which are likewise oriented toward the central axis of fixture 124 to provide for fixation of the center of a mounted element upon thermal expansion thereof.

The dimensions of the afore-described posts and supports are such that: (1) the concave side of the intermediate screening masters 92 and the concave side of the intermediate mask master 90 are separated along the tube axis by the same distance as the concave side of the mask 12 is spaced from the faceplate 6 in the end-product tube; (2) the convex side of the prime master 84 is nominally spaced about 0.025 inch from the concave side of the intermediate mask master 90; and (3) the convex side of the working screening masters 100-106 is nominally spaced about 0.025 inch from the concave side of the associated intermediate screening master 92.

Intermediate Screening Master Generation – FIGS. 41–45

A discussion of a process for making intrmediate screening masters 92 alluded to briefly as part of step 88 in FIG. 13, will now be described in detail, particularly with reference to FIGS. 41–45.

An early step in the making of intermediate screening masters 92 according to this method involves providing a rigid and transparent intermediate screening master blank 145, preferably in the form of a highly polished sheet of glass having a spherical curvature corresponding to the spherical curvature of the faceplate of the end-product tube. As in the preparation of the intermediate mask master blank 116, there is applied to the concave surface of the blank 145 a layer 146 of durable, opaque stencil material such as iron oxide or chromium. Mounting elements 147 are attached to the concave side of the intermediate screening master blank — these preferably have the same balltype structure, and are attached by the same method, as shown and described above with respect to the mounting elements 114 for the prime master 84. A coating 148 of a suitable photoresist material is then deposited on the opaque stencil layer 146 and baked.

The prime master stencil pattern 117 on the prime master 84 is transferred to the photoresist coating 148 on the intermediate screening master blank 145 by the use of a lighthouse including the exposure fixture 124, described above in connection with the making of the intermediate mask master 90. The fixture 124 has, as described, kinematic mounting means for supporting the intermediate screening master blank 145, comprising V-grooves 149 on posts 144a–144d for receiving mounting elements 147 on the blank 145. The lighthouse also includes means (not shown) for supporting a corrector plate 150. The corrector plate 150 may be of a conventional type used in the conventional screening of faceplates and is designed and is designed to compensate for the differences between the optical and electron shadow images of the shadow mask aperture pattern cast on the faceplate by the lighthouse light source 151 and cathode ray tube electron guns. A shading filter 152 of conventional type having a varying neutral density may also be provided for varying the relative exposure of the latent image areas on the photoresist coating 148, and thus ultimately for grading the size of the elements constituting the intermediate screening master stencil pattern. The spacing of the prime master 84 from the intermediate screening master blank 145 is not that associated with the aforedescribed near-contact exposure, but rather is preferably a spacing which simulates the spacing of the end-product shadow mask from the faceplate in an operative end-product color cathode ray tube, commonly termed the Q spacing.

As represented schematically in FIG. 43, a step in the photochemical transfer of the prime master stencil pattern 117 on the prime master 84 to the intermediate screening master blank 145 involves locating the blank 145, prime master 84, corrector plate 150, and shading filter 152 in fixture 124 and exposing the photoresist coating 148 to the source 151 of UV radiation. It is desirable that the intermediate screening masters 92 have a stencil pattern in the form of continuous vertical strips. This suggests that the effect of the tie bars (see 101 in FIG. 15) must be eliminated. As is well known to those skilled in the manufacture of slot-mask tubes, the tie bar shadows on the photoresist coating may be washed out by the use of a line-type source 151 and penumbra exposure behind the tie bars.

As shown in FIG. 43, exaggerated for clarity of illustration, the radius of curvature of the concave surface of the intermediate screening master blank 145 is related to, but slightly shorter than, the curvature of the convex surface of the prime master 84. The relationship of the radii of the intermediate screening master blank 145 and prime master 84 corresponds to that of the end-product tube faceplate 6 and shadow mask 12. More particularly, in the manufacture of a 19 inch tube according to this invention, wherein the faceplate has a spherical carvature of 31.191 inch radius, the intermediate screening master blank 145 has a spherical concave surface of 31.191 inch radius and the prime master 84 has a spherical (for economy of manufacture) convex surface of 32.494 inch radius.

After exposure of the photoresist coating 148 on the blank 145, the blank 145 is removed, the photoresist coating 148 developed, the opaque layer 146 etched, and the photoresist coating 148 stripped, all of which steps may be as described above in connection with the making of intermediate mask masters 90. These latter steps are shown in black box form in FIG. 44. The resulting intermediate screening master is illustrated schematically as 92 in FIG. 45. The finished intermediate screening master stencil pattern is denoted 153.

In the manufacture of color cathode ray tubes according to this invention, four intermediate screening masters 92 are required — one for use in screening the black grille, and one each for screening the red-emissive, blue-emissive and green-emissive phosphor patterns into the grille openings, as explained in more detail below. Each of these four intermediate screening masters may be made by the process described above, the primary variation being in the nature of the light illumination pattern used to expose the photoresist coating 148. In the instance wherein the grille intermediate screening master is being produced, there is employed light sources in three lighthouses (or one source in three locations in a single lighthouse) simulating the locations of the three electron beams in the endproduct cathode ray tube. With three exposures to light sources in the three different locations, the photoresist coating 148 will be exposed at every locating where it is desired to ultimately have a grille opening, i.e., at every location where it is ultimately desired to have a phosphor element. It should be understood, of course, that the nature of the illumination pattern cast on the photoresist coating 148 is dependent on the polarity of the prime master stencil pattern 117 and on whether the photoresist is of the positive-working type or negative-working type. It is preferred that the prime master stencil pattern be a positive image of the end-product shadow mask aperture pattern and that the photoresist pattern developed in the photoresist coating 148 be a positive image of the prime master stencil pattern 117. The intermediate screening master stencil pattern 153 thus formed will be a positive image of the prime master stencil pattern 117.

In the instance where the intermediate screening master 92 is to be used to make one of the working screening masters 102-106 for screening the red phosphor pattern, the blue phosphor pattern or the green phosphor pattern, a single light source is used in the lighthouse, located at the lighthouse location which apparently simulates the red-associated, blue-associated or green-associated electron beam source location in the end-product cathode ray tube. For example, in the making of the red phosphor pattern intermediate screening master, a light source is used which is positioned at the simulated location of the electron gun in the end-product tube which carries red-associated video information.

Working Mask Master Generation — FIGS. 46-49

In order to preserve an overview of the tube manufacturing process being described, a reference back again to FIG. 13 will be informative. There has been described up to this point the manufacture of the prime master 84, the intermediate mask master 90, and the four intermediate screening masters 92. The method by which the working mask master 96 (the master used in the actual assembly line production of masks) is generated from the afore-described intermediate mask master 90 will now be engaged, particularly with reference to FIGS. 46-49.

In the manufacture of a working mask master 96 from intermediate mask master 90, a working mask master blank 166 is provided. As shown in FIG. 46, the working mask master blank 166 preferably takes the form off a highly polished curved, rigid transparent glass element having a concave surface to which is attached ball-type mounting elements 172. The blank 166 preferably has a contour which corresponds to that of the end-product shadow mask 12 (bi-radial, e.g.). In the interest of economy, the blank may be spherical, an approximation to a bi-radial contour. The mounting elements 172 and their method of attachment may be as described above in the discussion of the generation of prime master 84. The convex surface of the working mask master blank 166 is coated with a durable opaque stencil material layer 174 (ferric oxide or chromium, e.g.) and a photoresist coating 176.

An intermediate mask master 90, generated as described above, and the coated working mask master blank 166 are positioned accurately in a working mask master fixture 124' corresponding generally to the universal fixture 124 (FIG. 47). It should be understood that the fixture 124' in commercial practice would not be the very same fixture 124 as used to make the intermediate mask master 90 or the intermediate screening master 92, but rather would represent a very close replication of the parts of the fixture 124 which are used. However, for purposes of this immediate discussion and in the interest of furthering an understanding of the novel method of color tube manufacture under description, the working mask master fixture 124' may be assumed to be identical to the universal fixture 124.

The working mask master fixture 124' provides a kinematic mounting for the working mask master blank 166, shown schematically as V-grooved posts 180, corresponding to posts 126a-126c in fixture 124, which receive the mounting elements 172. The fixture 124' also includes a set of apertured supports 181, corresponding to supports 142a-142d in the fixture 124, for holding the intermediate mask master 90. The dimensions of the intermediate mask master 90, the blank 166 and the various structures in the fixture 124' for precisely positioning the intermediate mask master 90 relative to the working mask master blank 166 are such that the convex surface of the blank 166 and the concave surface of the intermediate mask master 90 have the near-contact relationship described above and depicted schematically in FIG. 33. The concave surface of the intermediate mask master 90 and the convex surface of the working mask master blank 166 have substantially the same curvature and are separated by a distance which is slightly greater than the sum of the deviational tolerances on the convex surface of the blank 166 and the intermediate mask master 90. By way of example, the deviational tolerance on the concave surface of the intermediate mask master 90 may, e.g., be ± 10 mils; the deviational tolerance of the convex surface of the blank 166 may, for example, be ± 10 mils. In this example, the blank 166 and master 90 are preferably spaced a nominal distance in the range of about 21 mils to 55 mils, for example about 30 mils.

With the blank 166 and the master 90 thus positioned in the fixture 124', the intermediate mask master stencil pattern 130 on the concave side of the master 90 is photochemically transferred to the working mask master blank 166 by photoexposing the photoresist coating 176 through the intermediate mask master 90, developing the exposed photoresist coating 176, etching the underlying opaque stencil layer 174 and stripping the photoresist layer coating 176 (FIG. 48). These operations result in the formation of a working mask master stencil 182 having thereon a working mask master stencil pattern 183 (FIG. 49). The finished working mask master stencil 182, mounted in place on the working mask master fixture 124', constitutes a finished working mask master 96.

Convergent Center-of-Deflection Lighthouse – FIG. 50

In the above-described photochemical transfer of the intermediate mask master stencil pattern 130 on the concave surface of the intermediate mask master 90 to the working mask master blank 166 involves irradiating the photoresist coating 176 on the convex surface of the working mask master blank 166 with convergent center-of-deflection radiation (preferably UV light). As used herein, "convergent center-of-deflection" irradiation is intended to mean the irradiation of an object with radiation focused substantially to a spot at the simulated apparent location of the point of deflection of the electron beams in the end-product cathode ray tube. Unlike the case of divergent center-of-deflection irradiation described above with respect to the manufacture of intermediate mask and screening masters, in the case of convergent center-of-deflection irradiation, a source of light located radially outwardly beyond the object to be irradiated must be provided, along with means for converging the radiation at the simulated apparent center of electron beam deflection.

Whereas numerous light source and light converging structures may be employed to carry out the described convergent center-of-deflection irradiation of the working mask master blank 166, it is contemplated that a lighthouse 186 such as shown schematically in FIG. 50 may be employed. The FIG. 50 lighthouse 186 is shown as being capable of accomplishing convergent center-of-deflection irradiation by the provision of a light source, shown schematically as 188, in combination with a reflector 190 configured and constructed to focus light from source 188 at the simulated apparent center-of-deflection 191.

FIG. 50 shows the working mask master fixture 124' incorporated into the lighthouse 186. The light source 188 may be of conventional construction. In an application wherein a shadow mask tube of the so-called dot mask/dot screen type is to be manufactured, the light source 188 would be a point source of UV light. In the application wherein a slot mask/line screen tube is to be manufactured, the light source 188 would be a line source, as is well known in the art.

Working Screening Master Generation – FIGS. 51-54

A description will now be made of the method alluded to above for making the working screening masters 100-106, using the afore-described intermediate screening masters 92. FIG. 51 illustrates the provision of a working screening master blank 194 with attached mounting assemblies 196. The blank 194 preferably comprises a relatively thin, spherically curved, transparent glass element having a convex surface with curvature corresponding to the curvature of the convex surface of the end-product faceplate 6. As will be described in more detail hereinafter, it is desired that the working screening master blank 194 generally simulate a shadow mask in its flexibility characteristics in order that during the screening of a faceplate, the screening master will flex about its diagonals and thereby conform, in the manner of a shadow mask, to unit-to-unit deviations in the faceplate. By way of example, it is preferred that the working screening master blank be a sagged glass sheet of approximately 100 mils thickness composed of glass of the type BK 7.

The mounting assemblies 196 preferably simulate the mounting assemblies on the end-product shadow mask 12 in order that the working screening master can be mounted on a tube faceplate during faceplate screening operations. A more complete description of a finished working screening master constructed according to this invention will be given below, particularly with reference to FIGS. 55-60.

As shown schematically in FIG. 51, the blank 194 is coated with an opaque stencil material layer 198, as above, and a suitable photoresist coating 200, preferably of the positive-working type. The working screening master blank 194 and the intermediate screening master 92 are each mounted in a universal lighthouse exposure fixture as shown at 124 and the intermediate screening master stencil pattern 130 is photochemically transferred to the convex surface of the working screening master blank 194 (FIG. 52). Convergent center-of-deflection irradiation is employed to expose the photoresist coating 200 through the intermediate screening master 92. As in the generation of the working mask master 96, convergent center-of-deflection irradiation may be provided by the use of a lighthouse 86 as shown in FIG. 50.

As represented in black box form in FIG. 53, after exposure of the photoresist coating 200, the coating is developed, the underlying opaque layer 198 etched, and the photoresist coating stripped to produce a finished working screening master (FIG. 54) having a working screening master stencil pattern 203.

As will be evident from the above description, if the intermediate screening master 92 has a grille-related pattern on it, the finished working screening master will be a working grille master 100 (see FIG. 13). Similarly, if the intermediate screening master carries a master stencil pattern corresponding to one of the three phosphor patterns, then the finished working screening master will be one of the working phosphor pattern masters 102, 104 or 106.

The Working Screening Masters – FIGS. 55-60

A structuralized rendition of one of the working screening masters 100-106 is illustrated in FIGS. 55-60. For reasons to be described, each of the working screening masters is preferably capable of flexing about its diagonals to conform to unit-to-unit tolerance-related variations in the faceplates being screened. Stated in another way, the working screening masters should be indistinguishable from an end-product shadow mask, at least as to their mechanical influence on a faceplate 6. Briefly, the reason for this desired mechanical similarity between the working screening masters 100-106 and the end-product shadow mask 12 is as follows. If a shadow mask selected at random from a rack of shadow masks, when assembled in a tube, is to have its pattern of mask apertures register with the associated pattern of phosphor element triads on a screened faceplate, then the working screening masters must simulate the shadow mask during the screening process.

In the interest of simplifying this explanation, in the ensuing discussion the working screening master discussed will be assumed to be the working grille master 100. The discussion, however, is equally applicable to masters 102, 104 and 106. With the above-identified ends in mind, the working screening master 100 preferably comprises a thin (for example 100 mils thick), highly polished, spherical glass blank 194, the convex surface 206 of which contains the working screening master stencil pattern 203. The sphericity of the convex surface 206 corresponds to that of the concave inner surface of the faceplate 6.

In order to simulate the mounting means on the shadow mask 12, the working screening master 100 may have a skirt structure and a mounting assembly which closely resembles the skirt structure and mounting assembly of the shadow mask 12. In the FIGS. 55-60 embodiment, the working screening master 100 is shown as having a frame 210 formed integrally in one piece from a sheet of steel or other material similar to that used to make the shadow mask 12, and includes a stiffening channel 212, a skirt 214 and a stiffening lip 216 which closely resemble the corresponding structures on the shadow mask 12. Four corner-located mounting assemblies 196 resemble the corresponding assemblies used to suspend the shadow mask 12. Each of the mounting assemblies 196 comprises a bracket 220 (nontemperature compensated), supporting a spring 222 on which is mounted a lug 224. In order to locate the convex surface 206 of the blank 194 in near-contact relationship to the concave surface of a faceplate being screened during a screening operation, the blank 194 is attached to the frame 210 (as with epoxy-type cement) at an appropriate location near the base thereof.

FIGS. 57-60 represent a common enlarged area of the stencil patterns of the four different screening masters 100, 102, 104, 106. FIG. 57 shows the screening master stencil pattern for the black grille. FIG. 58 shows the screening master stencil pattern for the red phosphor pattern. FIG. 59 shows the screening master stencil pattern for the blue phosphor pattern. FIG. 60 shows the screening master stencil pattern for the green phosphor pattern. In each of the FIGS. 57-60 the clear areas represent spaces between opaque stencil material. It should be understood, of course, that whereas positive screening images are represented in FIGS. 57-60, the polarity of the stencil patterns on the screening masters is a function of the type of photoresist material used in the screening processes (i.e., whether the resist is negative-working or positive-working), the nature of the screening process, and other factors. For example, in the most widely used commercial process for depositing the black grille, and the one recommended here, the grille master stencil pattern (FIG. 57) would be of a positive polarity. The method alluded to is described in U.S. Pat. No. 3,632,339.

Shadow Mask Manufacture – FIGS. 61-65

To maintain a perspective on the description of the manufacture of a color cathode ray tube according to this method, recall that a brief overview of the entire tube making operation was given earlier with reference to FIGS. 5-12. It was noted that the manufacture of the color tube involved the use of five working masters -- a working mask master and four screening masters (a black grille master and three phosphor pattern masters). Methods and structures by which these five masters may be generated were described. A complete and detailed description of the various steps represented schematically in FIGS. 5-12 will now be undertaken.

The first steps to be described involve the preparation, metal-forming and etching of a mask blank 231, shown in FIG. 61. These steps are depicted generally by FIGS. 5-8 and much more specifically in the FIG. 62 flow diagram. Before undertaking a detailed description of the mask manufacturing processes of FIG. 62, a brief description of the structure of the mask blank 231 will be made. For reasons which will become clear as this description proceeds, the stock from which the mask blank 231 is made preferably comprises a substrate 232, for example 6 mils of 1008 steel, on which is plated an aperture-defining layer 234, preferably a ½ mil layer of nickel. Other mask structures may be employed. The use of a mask having the described composite structure does not, per se, constitute a part of this invention, being described and claimed in U.S. Pat. No. 3,794,873. As will be described in detail below, in the metal-formed end-product mask 12, the aperture-defining layer 234 is located on the concave side of the mask (toward the electron guns) and contains a pattern of mask apertures which effectively define the size and configuration of the mask apertures.

In FIG. 62, the various steps constituting the mask manufacturing flow diagram are shown in block box form and are largely self-explanatory. Certain of these steps, however, will be elaborated upon where additional information is thought to be helpful.

In the step numbered 4, the mask blank 231 is metal-formed, as by a multi-step stamping operation, such that the aperture-defining layer 234 is on the concave side. In the step numbered 8, the oxide (ferric) removal (to clean the blank) is preferably effected by the application of hydrochloric acid. In the step numbered 11, the protective coating is of material such as fish glue which is applied on the back side of the formed mask blank, on the mask mounting assemblies, and on other exposed metal areas which might be subjected to the etchant in the subsequent etching operation, but which are not to be etched.

Step numbered 13 is an important step in which the photoresist coating applied in step 10 to the concave side of the formed mask blank is exposed to light actinic to the coating through the working mask master stencil 182 (described above). A lighthouse in which the photoexposure of the coated mask blank is made will be described in detail after the description of this FIG. 62 flow diagram is completed.

In the step numbered 17, the aperture-defining layer 234 is etched, for example by the application of a 40% solution of ferric chloride at a temperature of between 125°-150° F for a period of approximately two minutes, or until such time as holes are formed completely through the layer 234. This etching step is described in detail in the referent U.S. Pat. No. 3,794,873. In a second etching operation the underlying steel substrate 232 is etched with an etchant such as ferric sulfate of 35% Baume concentration at a temperature of between 125°-150° F. In this second etching operation the nickel aperture-defining layer 234, as well as the underlying photoresist layer, act as a resist. The etching is continued for about six minutes or until the steel substrate 232 is etched through. Substantial undercutting of the aperture-defining nickel layer 234 will result from this etching step.

The etching operations may be carried out using etching techniques described in the U.S. Pat. No. 3,794,873, but preferably are carried out according to the teachings of the referent copending application Ser. No. 384,874. That application discloses apparatus and methods for directionally etching preformed shadow masks to reduce beam clipping at the edges of the mask. FIG. 63 is a fragmentary sectional view of a shadow mask etched according to that method. FIG. 64 and 65 are views of the FIG. 63 mask blank 231 as it would appear from the concave side (FIG. 64) and from the convex side (FIG. 65), a center portion of the blank being shown.

The remaining steps in the FIG. 62 flow diagram are deemed to be self-explanatory and represent, as well as those other steps not discussed, operations well-known to those skilled in the art of shadow mask manufacture. A finished shadow mask 12 as shown in FIGS. 1–4 is the output of the FIG. 62 flow of processes.

Photoexposure of the Mask Blank 231 – 66, 66A and 66B

It will be recalled that step 13 in the FIG. 62 mask manufacturing flow diagram constitutes a photoresist exposure step. A detailed discussion of lighthouse apparatus used to accomplish that exposure step will now be undertaken, particularly with reference to FIG. 66. As a prelude to this discussion, it is important to understand that during the photoexposure of the photoresist-coated mask blank 231, the mask master 96 mechanically simulates an end-product cathode ray tube faceplate. As described in detail above with respect to FIGS. 1–4, the novel shadow mask 12 is of a character such that it is relatively stiff with respect to its major and minor axes, but relatively flexible with respect to its diagonals. This characer of the shadow mask 12 is intended to permit the mask 12 to flex about its diagonals when it is mounted on a faceplate and thereby conform to flexural deviations from unit-to-unit in the configuration of production faceplates.

With the goal of providing masks which are interchangeable each with all others and faceplates which are interchangeable each with all others, because the end-product shadow mask 12 flexes to conform to a supporting faceplate, during the step 13 photoexposure operation the working mask master 96 preferably simulates a faceplate and the shadow mask blank 231 is preferably permitted to flex about its diagonals when it is mounted on the working mask master 96. Stted another way, the mask blank 231, and the shadown mask 12 produced therefrom, preferably should not be able to distinguish between their being supported by a faceplate or by a working mask master 96.

FIG. 66 is a side sectional view of a lighthouse 236 comprising a working mask master 96 mounted on a base structure. A formed mask blank 231 is supported by the mask master 96. It will be recalled from the description of FIGS. 46-49 that the working mask master 96 is actually comprised of two parts -- a working mask master fixture 124' (essentially a duplicate in pertinent structures of the universal exposure fixture 124) and a working mask master stencil 182 which is carried by the fixture 124'. (The working mask master 96 can be seen to closely resemble the combination of the prime master 84 mounted in the universal exposure fixture 124.) It will also be recalled that the working mask master fixture 124' was described as being in structuralized form effectively identical to the universal exposure fixture 124, with the exception that the V-grooved posts 144a, 144b, 144c used in the universal exposure fixture 124 to kinematically mount the intermediate screening master blank 145 are, of course, not needed and are eliminated.

The working mask master fixture 124' is illustrated as comprising V-grooved posts 180a–180c, represented schematically in FIGS. 47 and 49 as 180; these osts may correspond structurally to the V-grooved posts 126a, 126b, 126c in FIGS. 34-40. The fixture 124' is also illustrated as including a set of corner-located supports 181a–181d which may correspond in structural implementation to posts 142a, 142b, 142c, 142d in the universal exposure fixture 124 (FIGS. 34'40). As noted the V-grooved mounting posts 144a, 144b, 144c which comprise part of the universal exposure fixture 124 are not need in the working mask master 96 and have been eliminated therefrom. The lighthouse 236 is shown as including a housed light source 238, a shutter 240 and a shader plate 241 which may be constructed according to standard practices. The shader plate 241 may be employed to vary the exposure of the photoresist coating on the blank 231 as a function of location on the blank, for example in applications where it is desired to produce a grade in the size of the apparatus which will be ultimately etched through the blank 231.

The working mask master stencil 182 and the fixture 124' are so dimensioned as to establish the afore-described near-contact exposure condition during exposure of the photoresist coating on the concave surface of the blank 231. By establishng the described near-contact exposure condition (described in detail above in connection with FIG. 33), the penumbra effects during exposure are greatly reduced, permitting the use of a relatively large area light source 238 and thus greatly reducing the required photoresist exposure interval. By way of example, in the case where the mask blank 231 and the convex surface of the working mask master stencil 182 both have corresponding curvature (preferably bi-radial, but alternatively spherical, e.g.), assuming the mask blank 231 to have contour tolerances (measured from the plane of the lugs 242) of about ± 10 mils, the nominal spacing of the mask blank 231 from the working mask master stencil 182 is between about 21 and 55 mils, e.g., 30 mils. In the case wherein the convex surface of the working mask master 96 has the more economical spherical configuration and yet the mask blank 231 has the preferred bi-radial configuration, the near-contact condition cannot be established at all points on the blank 231. This will be better understood by reference to FIGS. 66A and 66B.

To effect exposure of the photoresist-coated blank 231 in the lighthouse 236, the formed and coated blank is mounted in fixture 124' by snapping lugs 242 constituting part of corner-located mask mounting assemblies 243 into lug-receiving openings 244 in the posts 181a-181d. By the provision of one horizontally elongated opening 244 in one of the posts 181a–181d, redundancy in the four-point suspension system is accounted for and the mask blank 231 will be supported by the posts 181a-181d in an equilibrium condition. The inherent redundancy in the suspension system can also be compensated by substituting for one of the leafsprings 30 a spring which is relatively narrow side-to-side such that it provides some lateral yield to accommodate an off nominal location of the redundant fourth lug-receiving opening 244. The same principles of redundancy compensation can be employed in suspending the finished mask 12 on the faceplate 6 of a working tube.

FIGS. 66A and 66B are highly schematic top and side sectional views of the coated shadow mask blank 231 and working mask master stencil 182, shown in distorted dimensions to illustrate the near-contact exposure condition which obtains when the addressing surfaces do not have corresponding curvature. As noted, in the example under description, the shadow mask blank 231 is bi-radial, whereas the working mask master stencil 182 is spherical. In this situation, the near-contact exposure condition obtains only at certain peripheral regions on the blank 231. In other regions, particularly the central region, the blank 231 is spaced from the stencil 182 so far as to exceed the desired near-contact exposure condition. Because of this, in the center region of the end-product mask, the resultant shadow mask apertures will not be formed as accurately as they would be if the near-contact exposure condition were established thoughout the blank 231. However, as is well known, in the center region of a shadow mask color tube, tolerances are easier to hold, the net result being that image quality in the center of the tube is at least equal to that at the periphery of the tube.

In more detail, FIG. 66B is a sectional view taken along lines 66B-66B in FIG. 66A. In the illustrated example, the bi-radial mask is configured such that the minor axis radius, $R_{mi}$, is greatest, for example 33.90 inches in a 19" diagonal tube. The major axis radius, $R_{ma}$, is the shortest, 30.75 inches for example. The radii of the diagonals $R_{di}$ may be 31.250 inches. It can be seen in FIG. 66B that the left side of the sectioned mask blank 231, representing a cut along the diagonal part of the section line 66B—66B, has a shorter radius of curvature than the mask blank section taken along that part of the section line 66B—66B lying on the major axis of the faceplate.

In accordance with the near-contact exposure principle, it is preferred to orient the spherically configured stencil 182 relative to th mask blank 231 according to the following prescription. First, an imaginary sphere 246 in FIG. 66B is found which simultaneously contacts point A at the extremity of the mask diagonal and point C at the extremity of the mask major axis, the imaginary sphere 246 having a radius $R_{246}$ equal to the radius $R_{182}$ of the convex surface of the stencil 182. The stencil 182 is then spaced from the sphere 246 according to the afore-described near-contact condition. For example, assuming the same contour tolerances on the mask blank 231 and the working mask master stencil 182 as given above, the nominal spacing of the stencil 182 from the imaginary sphere 246 is between about 21 and 55 mils, preferably about 30 mils. This, of course, results in a greater-than-near-contact spacing in the center region of the mask, the effects of which are noted above.

Screening of the Faceplate 6 - FIGS. 9 and 10

Let us return again to the overview flow diagram portrayed in FIGS. 5–12. Thus far there has been described processes for generating the working mask master 96 and the four working screening masters 100–106 and the operations by which the mask 12 is made. An explanation will not be made of the FIGS. 9 and 10 screening operations by which a phosphor screen is deposited on the inner surface of the cathode ray tube faceplate using the above-described working screening masters 100–106.

As discussed very briefly above, FIG. 9 represents the black grille deposition process. The black grille deposition process, insofar as its chemistry and photochemistry is concerned, may be conventional, for example as described in U.S. Pat. No. 3,632,339 — Kahn, assigned to the assignee of the present invention. Briefly, the process described in the Kahn patent includes the steps of depositing on the faceplate 6 a coating of a photosensitive material such as dichromated PVA (polyvinyl alcohol) and then exposing the coating to a light pattern through the working grille master 100. After exposure of the PVA coating, the coating is developed to yield a pattern of PVA strips whose distribution, size and shape correspond to the distribution, size and shape of the openings desired to be formed in the black grille. After development of the PVA coating, the faceplate is covered with a layer of a light-absorptive material such as graphite. The graphite layer is then dried and a chemical stripping agent such as hydrogen peroxide is used to strip the pattern of PVA elements from the faceplate, and with it the overlying light-absorptive material. The result is a black grille having openings whose distribution, size and shape are those which the phosphor elements are desired to have.

As shown schematically in FIG. 10, after the black grille 10 is photochemically deposited upon the faceplate 6, patterns of red-emissive phosphor elements 8R, green-emissive phosphor elements 8G and blue-emissive phosphor elements 8B are deposited in succession in the openings formed in the black grille 10. The chemical processes for screening the patterns of red-emissive, blue-emissive and green-emissive phosphor elements onto the faceplate may be according to standard practices in the art. Briefly, each of these phosphor screening operations may involve depositing on the black grille a photosensitive phosphor layer containing, typically, dichromated PVA and a phosphor material. The layer is dried and exposed to ultraviolet radiation in a lighthouse (described below) though the appropriate one of the working screening masters 102–106. The master stencil pattern on the working screening master would be of the nature shown in either of FIGS. 58, 59 or 60, depending on which phosphor pattern was being deposited.

After exposure of the photosensitive phosphorcontaining layer, the screening master is removed and the photosensitive layer developed to produce a pattern of phosphor elements filling one-third of the openings in the black grille 10. After successive deposition of the remaining two patterns of phosphor elements, all of the openings in the black grille 10 are filled. The faceplate 6 at this point in its processing contains on its inner surface a block grille 10 having in the openings thereof three interlaced patterns of red-emissive, blue-emissive and green-emissive phosphor elements. In the tube embodiment being described, namely a slot-mask, line-screen tube, the openings in the black grille 10 and the phosphor elements 8R, 8B, and 8G deposited therein are configured as strips which extend from the top to the bottom of the screen without uniterruption.

In each of the described four screening operations (black grille and three phosphor patterns), the principle of near-contact exposure is practiced. This principle is discussed above with reference to FIG. 33. The use of the nearcontact exposure principle in screening the faceplate results in the formation of highly accurate light illumination patterns on the photosensitive coatings, and consequently in the formation of a phosphor screen whose effective active phosphor elements are positioned with high accuracy and whose shape and size are precisely controlled. Further, by the use of the near-contact printing technique, and the resultant greatly reduced penumbra, greatly reduced screening exposure intervals are permitted. The consequent reduction in number of light-houses needed for a given faceplate screening rate effects economies in the end-product tube cost. The near-contact printing principle, as it is employed in the faceplate screening operations, will be discussed further in connection with the description immediately hereafter of screening lighthouse apparatus which may be employed.

Screening Lighthouse 260 – FIGS. 67-70

The screening of faceplate 6 is preferably accomplished in a lighthouse 260 shown schematically in FIGS. 67–69. The lighthouse 260 is illustrated as comprising a base 261 within which is contained a source 262 of ultraviolet radiation. In the manufacture of line screen tubes, the light source is preferably of the line, oriented in the direction in which the phosphor strips are to be formed on the faceplate 6.

The lighthouse 260 includes on the base 261 a fixture 259. The fixture comprises a table 263 having a set of three prealignment posts 265a, 265b, 265c for realigning a faceplate 6 to be screened, and a set of three support posts 266a, 266b, 266c for supporting the weight of the faceplate 6. The prealignment posts 265a, 256b, 265c and the support posts 266a, 266b, 266c may be of conventional construction.

To precisely align the faceplate 6 during the photoexposure operations, there is provided a set of three alignment chucks 267a, 267b, 267c in three corners of the table 263 for receiving three studs 36 (see FIG. 3) extending from the corners of the faceplate 6. Each of the chucks is shown as comprising a pair of spring jaws 268, 269 supported by a base structure 270. The alignment chucks 267a, 267b, 267c are anchored to the table 263 with a high degree of positional accuracy, and, by the stud-centering effect thereof, they accomplish a precise positioning of the faceplate 6 in the fixture 259.

During each photoexposure operation, one of the working screening masters 100–106 is employed to determine the illumination pattern cast on the faceplate 6. The selected working screening master (for discussion purposes, assume it is the working grille master 100) is suspended on the studs 36 by engagement of the lugs 224 in the lug-receiving openings 34 in the studs. As stated above in the discussions of FIG. 9 and 10 and in the description of the working screening masters (FIGS. 55–60), the working screening master stencil pattern is supported in near-contact relationship to the inner surface on the faceplate 6. This is achieved by appropriate dimensioning of the master and its mounting assemblies. By way of example, assuming a contour variation in the working screening masters 100–106 of about ± 15 mills and in a production faceplate 6 of about 22 mils (measured from the plane of the lug-receiving openings 34 in the studs 36), the nominal spacing of the working screening masters 100–106 from the faceplate is caused to be between 39 and 72 mils, e.g., about 50 mils.

As discussed at some length above in connection with the manufacture of the working screening masters 100–106, each is capable of flexing about its diagonals to simulate the flexure of a shadow mask 12.

Simplified Negative Guardband Process — FIGS. 71–76

As noted above in the BACKGROUND OF THE INVENTION, one of the shortcomings of the present commercial process of making negative guardband, black surround tubes lies in the way the phosphor elements are caused to have an effective size (in the case of line screen tubes as here described, an effective width) which is smaller than the size (or width) of the apertures in the associated shadow mask. As noted above, the two commercially practiced ways of accomplishing this size differential between th phosphor elements and the mask apertures is: (1) to use a shadow mask having apertures of reduced size, and after screening the faceplate with such a mask, to enlarge the mask apertures by a second etching operation, or (2) to use a mask with full-sized apertures and to employ photoreduction or other reducing techniques for reducing the black grille hole size to produce phosphor elements effectively smaller than the associated mask apertures.

By the novel method under description, wherein separate screening masters are employed to make the black grille 10 and the three interlaced patterns of phosphor elements 8R, 8B, 8G, the conventional re-etching or grille hole reduction methods are obviated.

In more detail, particularly with reference to FIGS. 71–76, there is shown in highly schematic form the manner in which the negative guardband condition can be established without the need for mask re-etching or grille hole reduction operations. In FIGS. 71–76 is shown a portion of a working mask master 96 having a working mask master stencil pattern 183 with an opening 275 whose size (in this case whose width) corresponds to the ultimate slot width in the end-product shadow mask 12. In FIGS. 73 and 74 is shown a portion of one of the working screening masters 100–106. The master has a screening master stencil pattern 203 corresponding to one of the three patterns of phosphor elements. FIGS. 75 and 76 illustrate a working grille master 100 for use in making the black grille.

The opening 276 in the stencil pattern on the working grille master 100 is narrower than the corresponding opening 275 in the working mask master 96 by an amount equal to the allotted guardband. The opening 277 in the stencil pattern 203 on the working screening master for depositing the red-emissive, blue-emissive and green-emissive phosphor elements is slightly wider than the openings 276 in order to permit the phosphor elements to slightly overlap the edges of the openings in the black grille 10, and thereby to ensure that these openings are completely filled. It will be evident that the openings 276 in the working grille master stencil pattern effectively define the active or visible area of the phosphor elements 8R, 8B, 8G; perimetric areas of the phosphor elements which overlap the black grille 10 do not contribute to the light seen by an observer of the tube since light emitted by these perimetric areas is absorbed by the black grille.

Thus by appropriately sizing the respective openings in the working mask master and screening masters, the desired negative guardband condition and negative guardband values can be provided without resort to the more expensive and less precise mask re-etching or grille hole reduction techniques.

On-Axis Screening Photoexposure

One of the drawbacks of the prior art screening methods has to do with the diverse nature of the lighthouses needed and the number of exposures which are required to deposit the phosphor screen. In a tube factory which uses the afore-discussed photoreduction method of making negative guardband tubes, each screening production line requires six different lighthouses — three for use in the photoprinting of the black grille and three for use in the photoprinting of the phosphor patterns, each of the six lighthouses being different from all others. In particular, one of the lighthouses used in the photoprinting of the black grille will have a grille-related light source located in the off-axis position associated with the red information. Second and third lighthouses will have similar grille-related light sources, but the light sources will be located at the blue-associated and green-associated off-axis positions. The three lighthouses used to screen the phosphor patterns will be somewhat different from the grille-screening lighthouses and will have light sources located respectively in the red-associated, green-associated and blue-associated off-axis positions. Six exposures of the faceplate are required by this method; the provision of six mutually differnet lighthouses is necessitated.

In a tube factory in which the mask re-etch method of making negative guardband tubes is employed, two like sets of three different lighthouses may be used — one set is used in the photoprinting of the grille and the other set in the photoprinting of the phosphor patterns. In this latter method, six different exposures are still required, but three, instead of six, different lighthouses must be provided. Yet there remains room for improvement in the number of different lighthouses required and in the number of photoexposure operations which must be made to screen a faceplate.

In accordance with an aspect of the tube manufacturing method with which this invention is associated, all photoexposure operations for depositing the screen are performed in identical lighthouses and the number of photoexposure operations required to screen a negative guardband, black surround faceplate is reduced from six to four.

It has been discovered that, contrary to what might be expected, in the use of the afore-described near-contact exposure principle to photochemically deposit the black grille, a more precise grille hole pattern can be produced when a single exposure is made through a grille screening master with a single on-axis light source, than when three exposures are made in sequence through three grille screening masters using three light sources located respectively in the three off-axis positions associated with the red, blue and green electron gun locations. By the use of this on-axis exposure principle, there is obviated three successive off-axis exposures in three different lighthouses, with consequent economies in tube cost.

It has also been found that in the interest of standardizing the lighthouses in a tube factory, without sacrificing fidelity of the replicated screening master stencil pattern images, the light sources used to expose the photosensitive coatings deposited in the formation of the red-emitting, blue-emitting and green-emitting phosphor patterns may also be located on the central axis of the faceplate.

Referring again now to FIGS. 67–69, the light source 262 in lighthouse 260 is located precisely on the center axis 280 of the lighthouse 260 (also the center axis of the faceplate 6). The same lighthouse 260 (or one identical thereto) may be used in the photochemical deposition of the black grille and the three patterns of phosphor elements. A total of four, rather than six, screening exposures are required.

Aluminization and Final Assembly — FIGS. 11 and 12

Returning once again to the basic FIGS. 5-12 flow diagram, it is seen at this point in the overall tube manufacturing process that the black grille and three interlaced patterns of phosphor elements have been deposited. The next major operation is the aluminization of the phosphor screen. This step may be performed by conventional techniques and processes; these typically involve spraying or otherwise depositing over the screen a lacquer film which serves to smooth out the irregularities in the relatively rough surface presented by the patterns of interlaced phosphor elements, and to thereby provide a better base for deposition of an aluminum layer. The aluminum layer is deposited according to standard practices by positioning the screened and "filmed" faceplate on an evacuable enclosure, evacuating the enclosure, and evaporating a very thin layer of aluminum (typically 1500 A thick) onto the film.

The entire faceplate assembly is then baked in what is commonly termed the faceplate "bake-out" operation. During the bake-out operation all the volatile organic substances deposited on the faceplate, principally the PVA employed in the formation of the phosphor patterns and organics in the lacquer film, are driven off.

The final processing and tube assembly operations are depicted collectively in schematic form in FIG. 12. These operations may be substantially conventional, with certain exceptions to be pointed out hereinafter. The conventional processing and assembly operations include: (1) bonding the faceplate 6 to the funnel 4 by the use of a devitrifying glass, commonly termed a "frit," (2) inserting the electron gun assembly into the neck of the tube, (3) exhausting the tube and sealing off the neck while the tube is in an exhausted state, and (4) flashing a "getter" - typically an appendage of the electron gun assembly which chemically "gets" gas particles remaining in the tube after evacuation.

There are, of course, many other tube manufacturing operations less basic than those described, which will not be described. These may be performed according to conventional methods.

The Interchangeability and Interregistrability of Masks and Faceplates — FIGS. 77–82

As suggested above, whereas many of the aforedescribed principles, methods and structures are applicable to the manufacture of color cathode ray tubes in general, the invention is primarily directed to the manufacture of color tubes of the shadow mask-type in which: (1) the screen-bearing faceplates are interchangeable each with all others, i.e., any faceplate can be substituted for any other faceplate, (2) the color selection (shadow) masks are interchangeable each with all others, and (3) any mask can be assembled with any screen without causing an intolerable misregistration between the assembled mask aperture pattern and associated phosphor screen pattern, i.e., the masks and screens are interregistrable. If the masks and faceplates are not sufficiently alike to be interchangeable, compensations must be made which will permit their interchangeability.

In the process under descirption, five working masters are provided — one working mask master 96 and four working screen masters 100–106. It is evident that if mask interchangeability and faceplate interchangeability is to be achievable, each of these masters must be effectively interregistrable with all others. An explanation of how the working masters are caused to be interregistrable will now be made. As used herein, the term "interregistrable" is intended to be interpreted in a broad sense as applying not only to patterns which are physically brought into registry, within tolerance limits, at some point in the tube manufacturing process or in the end-product tube (the mask aperture pattern and screen phosphor pattern, e.g.), but is also intended to apply to patterns which correspond, within tolerance limits, in pattern element distribution but which may not ever be physically brought into registered relationship. An example of the latter is the working screening and mask masters. As used herein, registration is meant with reference to a simulated apparent beam center-of-deflection point.

As explained in detail above, the working masters 100-106 are made from a family of intermediate masters 90, 92. These are in turn spawned from a single prime master 84, the progenitor of the working masters 96 and 100-106.

Let us take a closer look at how the intermediate masters are made, particularly with a view to understanding how they are caused to also be interregistrable. It will be recalled (see FIGS. 26-30) that the intermediate mask master 90 is made on the universal exposure fixture 124. Similarly, the intermediate screening masters 92 are made on the same universal fixture 124 (see FIGS. 41-45). The intermediate mask master 90 and the intermediate screening masters 92 are all made using the prime master 84. It is thus manifest that the intermediate mask and screening masters 90, 92 are interregistrable.

Having shown that the intermediate masters 90, 92 are interregistrable, let us now verify that the working mask and screening masters (which are made from the intermediate masters) are also interregistrable. Recall that the intermediate mask master 90 is placed in the universal fixture 124 and used to make the working mask master stencil 182 (FIGS. 46-49) and that the working mask master stencil 182 and the fixture 124' (effectively a duplicate of the fixture 124) together constitute the working mask master 96. It may also be recalled (refer particularly to FIG. 52), that the working screening masters 100-106 are made in the fixture 124 using the intermediate screening masters 92. Since the working mask master 96 and the working screening masters 100-106 are made in or with the same universal fixture 124 using the interregistrable intermediate mask and screening masters and exposed along simulated electron trajectories, it is clear then that the working mask and screening masters are each interregistrable with all others.

Let us take a look now at the actual manufacture of masks and screens to see how they are caused to be interregistrable and respectively interchangeable. Referring particularly to FIGS. 49 and 66 it is recalled that the working mask master 96 comprises the fixture 124' and the working mask master stencil 182. Since each mask blank 231 is exposed in the same working mask master 96 from a light source positioned at a simulated apparent center-of-deflection location so that the light rays simulate electron trajectories in the faceplate region of the end-product tube, the patterns of apertures ultimately formed in the resultant shadow masks 12 are interregistrable and all masks 12 are therefore interchangeable.

In the photoprinting of the black grille and phosphor patterns on faceplates 6, the faceplates are photoexposed in the same lighthouse 260 to a center-of-deflection-located light source through working screening masters 100-106 attached to and carried in the manner of a shadow mask 12 by the faceplate-mounted studs 36. Manifestly then, the resultant screen patterns formed on the faceplates are interchangeable each with all others and each faceplate screen pattern is interregistrable with any shadow mask aperture pattern with which it might be associated.

A fuller appreciation and understanding of these principles of interregistrability and interchangeability may be had by reference to FIGS. 77, 78 and 79. The FIGS. 77-79 diagrams show that interregistrability of masks and screens is achieved in spite of certain within-tolerance irregularities in the masks, faceplates or mask suspension structures.

FIG. 77 depicts in highly schematic form, with grossly distorted dimensions, the photoprinting of a phosphor screen on a faceplate 300 having mask mounting studs 302, 304, the stud 302 having an irregularity — namely, it is longer than the stud 304. In FIG. 77, the faceplate 300 is shown as being supported by posts 306, 308 in a lighthouse 310. A source of UV radiation is shown at 312, the source 312 being positioned at the simulated location of the center of deflection of the electron beams in an end-product cathode ray tube. Attached to the studs 302, 304 is a screening master 314 which, in actual structural form, would appear as shown in FIG. 55. Openings 316, 318 in the master 314 result in the placement of phosphor elements 320, 322 on the faceplate 300.

FIG. 78 illustrates a shadow mask 324 having mounting springs 326, 328. The springs are shown deliberately distorted such that the mask 324 is supported off the nominal curved plane 330. A working mask master is shown schematically as 332, having light-transmissive openings 334, 336 which dictate the ultimate location of mask apertures 338, 340 in the mask 324. The light source 342 used during the photochemical formation of the apertures 338, 340 in the mask 324 is also located at the simulated location of the center of electron beam deflection in the end-product cathode ray tube.

As depicted in FIG. 79, upon conjunction of the faceplate 300 with a mask 324 during final tube assembly, the shadow mask 324 is mounted on the studs 302, 304 extending from the faceplate 300. An electron gun 348 produces an electron beam 346 whose center of deflection is substantially coincident, in effect, with the location at which the light sources 312, 342 were located during the photochemical production of the faceplate screen pattern and the mask apertures. Upon assembly if the shadow mask 324 on the faceplate 300, it is seen that by the use of mask and screening masters which simulate the faceplate and shadow mask, respectively, and by locating the light sources 312, 342 at the apparent center of deflection of the electron beams during the afore-described photoexposure operations, upon assembly of the mask 324 and faceplate 300 the phosphor elements 320, 322 register, within tolerable limits, with the apertures 338, 340 in the mask 324.

It is true that some degrouping error will result due to the off-nominal configuration of the mask, but these errors have been found to be acceptably small. For example, the configurational deviations of the shadow mask in production are expected to be ± 5 mils or less.

The degrouping error which results from an off-nominal configurational error of the shadow mask will result in a misregistration error between the shadow mask apertures and the phosphor elements which is well within tolerable limits, for example, in the order of ± 0.1 mil. Whereas in the afore-described FIGS. 77-79 example, irregular stud lengths and mask mounting elements have been selected to illustrate the feasibility of interchangeability in spite of within-tolerance irregularities, other irregularities, such as twists in the faceplate, irregularities in the contour of the faceplate, and configurational deviations in the mask itself, are similarly compensated.

Having shown that all masks are interchangeable each with the others and that all screen-bearing faceplates are interchangeable each with the other and that any mask may be mated with any faceplate, it remains only to explain how in the final assembly of faceplate and funnel it is assured that the faceplate/shadow mask assembly is properly referenced with respect to the source of electron beams.

For this explanation, reference may be had particularly to FIGS. 80, 81 and 82 which show tube structure for accomplishing the necessary referencing. As will be explained in more detail, it is preferred that the funnel 4 have molded integrally in three corners notches 352, 354, and 356. Referencing of the faceplate 6 and funnel 4, to be described, is not a part of this invention, per se, but is an invention described and claimed in the aforementioned copending applications Ser. No. 446,845 and Ser. No. 462,915. The method of the referent applications involves providing in the funnel three or more spaced inside funnel reference surfaces. In the illustrated preferred arrangement six reference surfaces are provided by the three notches 352, 354 and 356.

The faceplate 6 is provided with inside referencing means which define a number of faceplate reference surfaces correspondingly spaced and located to engage the funnel reference surfaces when the faceplate 6 and funnel 4 are assembled. In the illustrated preferred arrangement, the studs 36 have six edges which mate with the six reference surfaces on the notches 352-356, the six edges on the stud 36 serving as the faceplate reference surfaces.

In order to assure that the electron guns, when assembled, are properly referenced to the faceplate/mask assembly during sealing of the neck of the funnel to the funnel body, both the neck and the funnel body are referenced to a common external reference such as the center line of the neck sealing machine. One way to achieve this is to support the funnel on a lathe by means of blocks on the face of the rotated lathe element, which blocks engage the notches in the funnel, the blocks being referenced to the center line of the lathe. The lathe also contains a neck-mounting chuck on the same center line. Upon joining of the neck with the funnel body, the center line of the neck and the funnel body are made coincident.

Since the phosphor screen is deposited on the concave surface of the faceplate 6 by a working screening master 100-106 which is attached to the studs 36 during the photoexposure operation, the phosphor screen pattern is deposited with reference to the studs 36. When the faceplate 6 and funnel 4 are finally assembled, since the studs 36 make referencing engagement with the notches 352, 354, 356, the phosphor pattern is thus referenced to the electron gun assembly centered on the center line of the funnel neck.

An important result of using a corner mounted, torsionally flexible mask 12 and mechanically mimetic working screening masters 100-106 and intermediate mask master 90, is a substantial reduction over conventional tube structures in beam landing/phosphor element misregistration attributable to faceplate/funnel mismatch. When the faceplate 6 is sealed to the funnel 4 (a high temperature operation) the faceplate contour conforms to that of the funnel seal land. In conventional practice, e.g., in dot screen tubes having a three point mask suspension system, a panel "tilt" during funnel mating of 15 mils, will yield a beam landing/phosphor element misregister in the screen corners of about 5 mils. In the tube and tube manufacture under discussion, a misregister of less than 1 mil results.

Thus it is seen that by the method of this invention, interchangeability of masks and screens is provided with complete assurance that upon assembly of the faceplate/mask assembly in a tube, referencing of the assembly to the electron guns is assured.

The invention is not limited to the particular details of construction of the embodiments depicted and other modifications and applications are contemplated. Certain changes may be made in the above-described methods and apparatus without departing from the true spirit and scope of the invention herein involved. It is intended that the subject matter in the above depiction shall be interpreted as illustrative and not in a limiting sense.

What is claimed is:

1. For use in the manufacture of rectangular color cathode ray tubes, and particularly for use in photoprinting a phosphor screen on a rectangular, three-dimensionally curved faceplate of a color cathode ray tube which has master mounting means in at least three corners thereof, a screening master comprising:
   a rectangular, transparent, torsionally flexible substrate having a curvature corresponding substantially to the curvature of the faceplate, on the convex surface of which is disposed a screening master stencil pattern; and
   a master suspension element in at least three corresponding corners of said substrate for engaging said master mounting means to suspend said substrate in spaced adjacency to the concave surface of the faceplate, the corner suspension and torsional flexibility of said master being effective to cause the master to flex about a diagonal and conform to a faceplate when mounted thereon.

2. For use in the manufacture of a rectangular color cathode ray tube which is characterized by having a flangeless, rectangular, three-dimensionally curved faceplate and a similarly curved shadow mask suspended adjacent to the faceplate by means of a suspension system which includes suspension means in at least three of the faceplate corners, the shadow mask being flexible about its diagonals so as to conform to the faceplate when suspended thereon, and particularly for use in photoprinting a phosphor screen on such a faceplate, a screening master comprising:
   a rectangular, glass substrate which is felxible about its diagonals and which has a curvature corresponding substantially to the curvature of the faceplate, on the convex surface substrate of which is disposed a screening master stencil pattern corresponding to a pattern of electron-transmissive apertures in said mask;

a master suspension element in at least three corresponding corners of said substrate for engaging the said suspension means in the corners of said faceplate to suspend said substrate in closely spaced adjacenty to the concave surface of the faceplate, the corner suspension and torsional flexibility of said master being effective to cause the master to mechanically simulate the corner suspension and torsional flexibility of said shadow mask, whereby a phosphor screen printed on said concave surface of said faceplate by the use of said master will be interregisterable with the pattern of electron-transmissive apertures in a shadow mask ultimately suspended on said faceplate.

* * * * *